(12) United States Patent
Gagne

(10) Patent No.: US 6,337,778 B1
(45) Date of Patent: Jan. 8, 2002

(54) DISK DRIVE EMPLOYING VECTOR ADDITION OF PRIMARY PHASE WRITE CLOCK SIGNALS FOR GENERATING SECONDARY PHASE WRITE CLOCK SIGNAL

(75) Inventor: Jean-Sebastien Gagne, San Diego, CA (US)

(73) Assignee: Western Digital Technologies, Inc., Lake Forest, CA (US)

( * ) Notice: Subject to any disclaimer, the term of this patent is extended or adjusted under 35 U.S.C. 154(b) by 0 days.

(21) Appl. No.: 09/318,477

(22) Filed: May 25, 1999

(51) Int. Cl.⁷ .............................. G11B 5/09; G11B 5/02
(52) U.S. Cl. .............................. 360/51; 360/68; 360/46
(58) Field of Search .............................. 360/51, 68, 46

(56) References Cited

U.S. PATENT DOCUMENTS

| | | |
|---|---|---|
| 5,541,961 A | 7/1996 | Farrow |
| 5,598,364 A | 1/1997 | McCall et al. |
| 6,028,727 A * | 2/2000 | Vishakhadatta et al. ...... 360/51 |
| 6,111,712 A * | 8/2000 | Vishakhadatta et al. ...... 360/51 |

* cited by examiner

*Primary Examiner*—Regina Y. Neal
(74) *Attorney, Agent, or Firm*—Milad G Shara

(57) ABSTRACT

A disk drive includes a disk having a recording surface and a write element for writing a sequence of symbols in a continuous-time signal on the recording surface. The disk drive includes a frequency generator for generating a plurality of primary phase write clock signals having a channel frequency $f_{ch}$. Each of the primary phase write clock signals has a selected primary phase shift from another one of the primary phase write clock signals. The disk drive includes a programmable phase synthesizer for generating a secondary phase write clock signal having the channel frequency $f_{ch}$ and a selected secondary phase shift from one of the primary phase write clock signals. The programmable phase synthesizer includes programmable means for selecting two of the primary phase write clock signals and element for performing vector addition of the selected primary phase write clock signals to generate the secondary phase write clock signal. The secondary phase write clock signal is used for providing at least one of the symbols in the sequence of symbols to the write element.

23 Claims, 12 Drawing Sheets

DISK DRIVE EMPLOYING VECTOR ADDITION OF PRIMARY PHASE WRITE CLOCK SIGNALS FOR GENERATING SECONDARY PHASE WRITE CLOCK SIGNAL

BACKGROUND OF THE INVENTION

1. Field of the Invention

The present invention generally relates to generating a write clock signal for writing data in hard disk drives. More particularly, the present invention relates to a disk drive employing vector addition of primary phase write clock signals for generating a secondary phase write clock signal.

2. Description of the Prior Art

A huge market exists for hard disk drives for mass-market host computer systems such as servers, desktop computers, and laptop computers. To be competitive in this market, a hard disk drive must be relatively inexpensive, and must accordingly embody a design that is adapted for low-cost mass production. In addition, it must provide substantial capacity, rapid access to data, and reliable performance. Numerous manufacturers compete in this huge market and collectively conduct substantial research and development, at great annual cost, to design and develop innovative hard disk drives to meet increasingly demanding customer requirements.

Each of numerous contemporary mass-market hard disk drive models provides relatively large capacity. Nevertheless, there exists substantial competitive pressure to develop mass-market hard disk drives having even higher capacities. Another requirement to be competitive in this market is that the hard disk drive must conform to a selected standard exterior size and shape often referred to as a "form factor." Generally, capacity is desirably increased without increasing the form factor or the form factor is reduced without decreasing capacity.

Satisfying these competing constraints of low-cost, small size, and high capacity requires a design that provides high format efficiency and high areal storage density. Format efficiency relates to the percentage of available area that is available for storing user data rather than being consumed by control data, gaps, etc. Areal storage density relates to the amount of data storage capacity per unit of area on the recording surfaces of the disks. The available areal density may be determined from the product of the track density measured radially and the linear bit density measured along the tracks. The available linear bit density depends on numerous factors including the performance capability of certain circuitry that is commonly referred to as a "write channel" and a "read channel." The write channel includes write precompensation circuitry that provides a write clock signal having a channel frequency corresponding to the rate at which data is to be written on the disk surface (the "data rate"). Increasing the data rate can increase the linear bit density. As the linear bit density increases, nonlinear magnetic transition shifts (non-linear intersymbol interference) may occur due to the magnetic interactions between closely spaced magnetic transitions. However, the read channel includes sampled data detection circuitry (such as a PRML channel, a EPR4 channel, and a E²PR4 channel) that assumes linear intersymbol interference between magnetic transitions recorded on the disk surface during the write operation. Therefore, the write precompensation circuitry in the write channel shifts the phase of the write clock signal in order to shift the time that magnetic transitions are recorded on the disk surface in order to compensate for this nonlinear transition shift problem. The phase shift magnitude in the write clock signal depends on the data pattern that has been and will be recorded on the recording surface.

It is known to provide a write precompensation circuit that includes several time delay circuits for generating write clock signals having a phase shift that is selected based on the data pattern. The phase shift generated by each time delay circuit is a percentage of the write clock signal. The resolution of the phase shift is determined by the number of delay circuits in the write precompensation circuit (e.g., 5% resolution requires 20 delay circuits). Each delay circuit requires sufficient current for generating the appropriate phase shifts within the clock period.

As the data rate and linear bit density increase, finer resolutions of the clock period are desirable. Increasing the number of time delay circuits can provide finer resolution (e.g., 2% resolution requires 50 delay circuits). However, this can increase the cost of the write precompensation circuit. Also, the additional time delay circuits can result in increased power consumption. Furthermore, increased current is required for each of the time delay circuits in order to timely generate the appropriate phase shifts within the increased clock period. This increased current can also result in increased power consumption.

For example, U.S. Pat. No. 5,598,364 (the '364 patent) discloses a write precompensation circuit that includes current controlled delay buffers connected to form a delay line having selectable output taps for providing time shift delays. The delay of each delay buffer is controllable by a secondary control current derived from a master control current such that the delay is a percentage of an oscillator period. The master control current is also used to control the period of a master write clock generated by a current-controlled ring oscillator of delay buffers. A disadvantage with the write precompensation circuit disclosed in the '364 patent is that the magnitude of the resolution for the time delay is limited by the number of delays buffers in the write precompensation circuit.

U.S. Pat. No. 5,541,961 (the '961 patent) discloses a digital communication system including a phase synthesizer for use in clock extraction circuitry. The phase synthesizer disclosed in the '961 patent requires complex circuitry for weighting and integrating two square wave signals to generate a phase-shifted output signal that is used in the clock extraction circuitry.

There is a need for a write precompensation circuit in a hard disk drive which produces finer resolution incremental steps for producing phase shifts in the write clock signal without requiring excessive power or excessive amounts of added circuitry.

SUMMARY OF THE INVENTION

The invention can be regarded as a disk drive comprising a disk having a recording surface and write means for writing a sequence of symbols in a continuous-time signal on the recording surface. The disk drive includes a frequency generator for generating a plurality of primary phase write clock signals having a channel frequency $f_{ch}$, each of the primary phase write lock signals having a selected primary phase shift from another one of the primary phase write clock signals. The disk drive further includes a programmable phase synthesizer for generating a secondary phase write clock signal having the channel frequency $f_{ch}$ and a selected secondary phase shift from one of the primary phase write clock signals. The programmable phase synthesizer includes programmable means for selecting two of the primary phase write clock signals and means for performing vector addition of the selected primary phase write clock signals to generate the secondary phase write clock signal. The disk drive includes means responsive to the secondary phase write clock signal for providing at least one of the symbols in the sequence of symbols to the write means.

The invention can also be regarded as a disk drive comprising a disk having a recording surface and a write means for writing a sequence of symbols in a continuous-time signal on the recording surface. The disk drive includes a frequency generator for generating a plurality of primary phase write clock signals having a channel frequency $f_{ch}$, each of the primary phase write clock signals having a selected primary phase shift from another one of the primary phase write clock signals. The disk drive further includes a plurality of programmable phase synthesizers for generating a plurality of secondary phase write clock signals having the channel frequency $f_{ch}$ and a selected secondary phase shift from one of the primary phase write clock signals. Each programmable phase synthesizer includes programmable means for selecting two of the primary phase write clock signals and means for performing vector addition of the selected primary phase write clock signals to generate one of the plurality of secondary phase write clock signals. The disk drive includes means for selecting a selected one of the secondary phase write clock signals. The disk drive further includes means responsive to the selected one of the secondary phase write clock signals for providing at least one of the symbols in the sequence of symbols to the write means.

The invention can also be regarded as a disk drive comprising a disk having a recording surface, write means for writing a sequence of symbols in a continuous-time signal on the recording surface, and means for providing a reference frequency signal. The disk drive further includes first programmable means for providing a channel frequency coefficient and a frequency synthesizer responsive to the reference frequency signal and the channel frequency coefficient for generating a plurality of primary phase write clock signals having a channel frequency $f_{ch}$. The frequency synthesizer includes a closed loop circuit for tracking the reference frequency signal to generate the plurality of primary phase write clock signals. Each of the primary phase write clock signals has a selected primary phase shift from another one of the primary phase write clock signals. The disk drive further includes a programmable phase synthesizer for generating a secondary phase write clock signal having the channel frequency $f_{ch}$ and a selected secondary phase shift from one of the primary phase write clock signals. The programmable phase synthesizer includes a second programmable means for selecting two of the primary phase write clock signals, and means for performing vector addition of the selected primary phase write clock signals to generate the secondary phase write clock signal. The disk drive includes means responsive to the secondary phase write clock signal for providing at least one of the symbols in the sequence of symbols to the write means.

DESCRIPTION OF THE PREFERRED EMBODIMENTS

Figure 1:
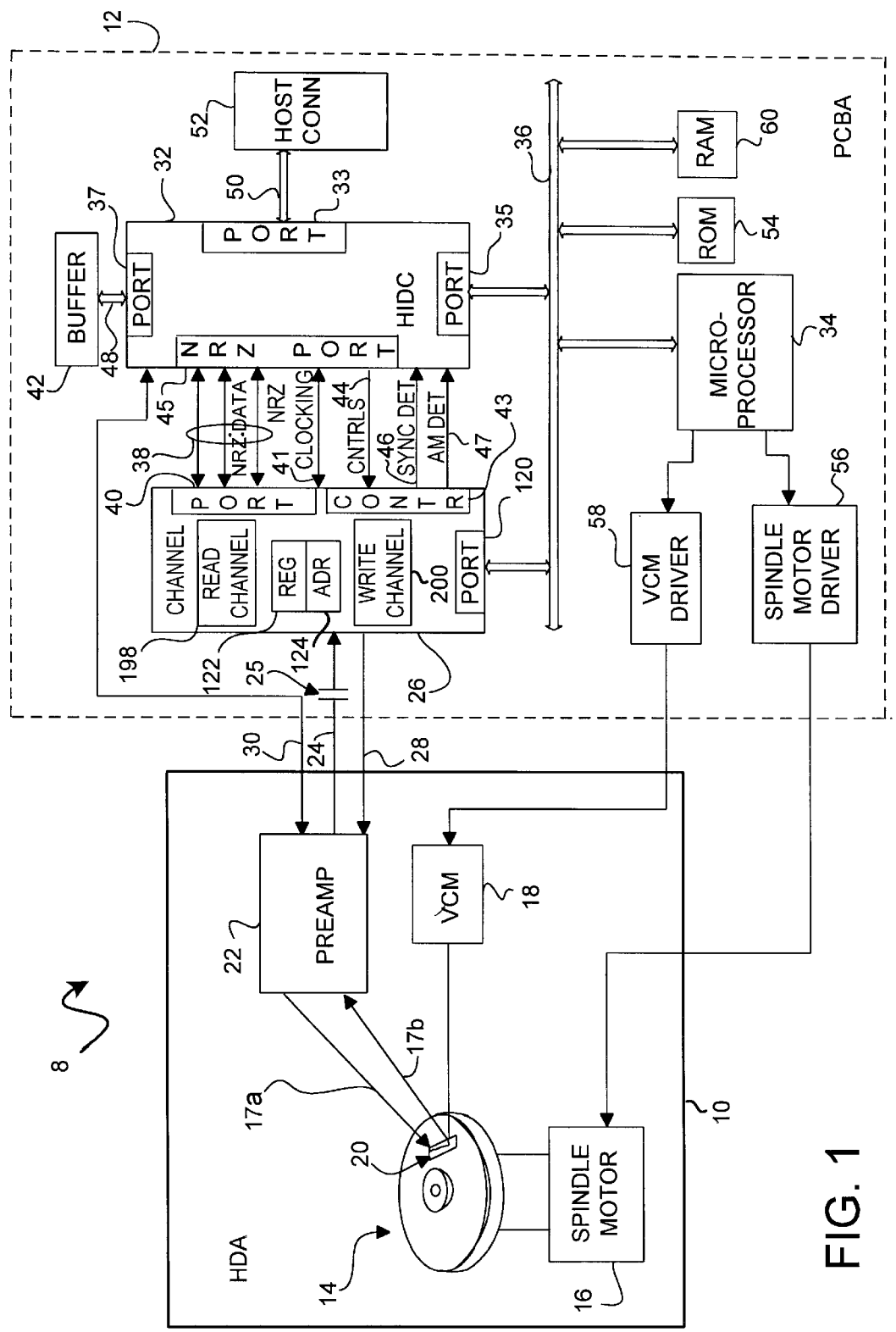
FIG. 1 is a block diagram of a hard disk drive according to an embodiment of the present invention.

Referring to FIG. 1, a disk drive 8 according to an embodiment of the present invention includes a head disk assembly (HDA) 10 and a printed circuit board assembly (PCBA) 12. HDA 10 includes a suitable number of magnetic disks 14, a spindle motor 16, a voice coil motor (VCM) 18, and a preamplifier 22. Spindle motor 16 is mechanically coupled to cause disks 14 to rotate at a high spin-rate. Suitably, each disk 14 provides two recording surfaces. Each of the recording surfaces has a plurality of data tracks. In one embodiment, the data tracks are arranged in an embedded servo format having interspersed servo-information regions and user-data regions.

Each of a suitable number of transducers 20 provides for reading from and writing to a respective one of the recording surfaces of disks 14. Suitable types of transducers 20 include an inductive transducer and a magnetic resistive (MR) transducer (or a giant magnetic resistive (GMR) transducer). Transducers 20 can include separate read and write transducers. When reading, each transducer 20 generates a low level analog read signal 17b, which for inductive heads and many MR heads is a differential signal. Analog read signal 17b is conveyed to signal inputs of preamplifier 22. Preamplifier 22 produces a read signal 24 which is an amplified, differential, analog read signal. HDA 10 also includes a path for conveying read signal 24 to PCBA 12; a path for conveying a write data signal 28 to preamplifier 22; and a path for conveying preamplifier control signals 30 for preamplifier 22. Under control of control signals 30, preamplifier 22 operates in either a read mode or a write mode and in either case communicates with a selected transducer 20.

During a write operation, preamplifier 22 provides write current via a write data signal 17a to a selected transducer 20 for writing a sequence of symbols $\{C'_n\}$ in a continuous-time signal on one of the recording surfaces of disk 14. The write current changes polarity upon each change in binary value of write data signal 28. The sequence of symbols $\{C'_n\}$ is adversely affected by timing error in the continuous-time signal. The timing error can result in errors during a read operation. An example of timing error is due to non-linear intersymbol interference between magnetic transitions recorded on the recording surface.

Read signals 17b and 24 have the same information content, and both are noise-corrupted. During a user-data read operation, each serially defines servo information and user data. The servo information includes gross-positioning data information including track identification data information, and fine-positioning information in the form of analog servo bursts.

Suitably, spindle motor 16 is a multi phase, brushless DC motor. Well known techniques can be employed for controlling spindle motor 16 to spin up to, and down from, a substantially constant angular velocity. VCM 18 is an element of a head-positioning servo system, and applies torque to a head stack assembly (not shown), which includes transducer 20, to swing the head stack assembly during a track-seeking operation and to maintain it at a desired angular position during a track-following operation.

PCBA 12 includes a channel 26 and a host interface and disk controller ("HIDC 32"). In one embodiment, channel 26 and HIDC 32 are each implemented as a single IC, and these two ICs in combination perform overall functions including basic timing functions. One such basic timing function entails the generation of the "global clock" and the synchronization of the global clock to the servo sample rate. In one embodiment, HIDC 32 contains circuitry for generating the global clock which is synchronized to the servo sample rate by a signal supplied by channel 26. In addition, HIDC 32 contains timing circuitry controlled by the global clock to provide timing signals used in de-multiplexing including separating servo data information from servo bursts and from user data. Alternatively, channel 26 includes the global clock and timer circuitry.

Irrespective of the allocation of such circuitry between channel 26 and HIDC 32, channel 26 provides, among other things, a signal processing path for processing read signal 24 to produce a clocked, serial-by-symbol data signal (i.e., a decoded binary data signal and accompanying clock signal). In this art, such a signal processing path that processes an analog read signal produced by a preamplifier to produce such a clocked serial-by-symbol data signal is commonly called a "read channel," such as indicated by read channel 198. Channel 26 also provides a signal processing path for processing a clocked serial-by-symbol data signal provided by HIDC 32 to produce a serial-by-bit data signal for the analog signal input of preamplifier 22. In this art, such an signal processing path is commonly referred to as a "write channel," such as indicated by write channel 200. The serial-by-symbol data signals propagate between channel 26 and HIDC 32 via a channel data bus 38. The clock signals for the serial-by-symbol data signals are shown collectively as NRZ CLOCKING 41.

Channel 26 is coupled to receive read signal 24 through a set of coupling capacitors 25 and has a port 40 connected via bus 38 to an NRZ port 45 in HIDC 32. Ports 40 and 45 and interconnecting bus 38 propagate data in a clocked, serial-by-symbol form referred to herein as non-return-to-zero (NRZ) form. The terms "NRZ" and "NRZI" (Non-Return to Zero Inverted) as used herein have their customary meaning in this art. That is, NRZ refers to a coding system in which a binary 1 is represented (at an instant in time indicated by a clock signal) by a first level or state and a binary 0 is represented (at an instant in time indicated by a clock signal) by a second level or state. NRZI refers to such a clocked coding system in which a binary 1 is represented by a transition from a first level or state to a second level or state and a binary 0 is represented by the absence of a transition.

In one embodiment, channel 26 supports use of a partial response, maximum likelihood (PRML) coding system. The term "PRML" as used herein refers to a type of signal processing employing sampled and equalized values of an input signal which are evaluated over several samples to estimate symbols contained in the input signal. PRML is one type of a broader class of signal processing systems referred to as "sampled-data processing systems."

Irrespective of the allocation of the sector timer function between channel 26 and HIDC 32, HIDC 32 performs numerous control functions for the disk drive including host interface functions to manage transfer of data between the disk drive and the host, and certain disk controller functions to manage the operation of channel 26 in writing and reading data. Incident to such disk controller functions, HIDC 32 has circuitry for producing certain timing and control signals that are part of a set identified collectively as timing and control signals 44 which are sent between channel 26 and HIDC 32.

PCBA 12 also includes a data buffer 42, a microprocessor 34, a read only memory (ROM) 54, a writeable random access memory (RAM) 60, a VCM driver 58 for supplying current to VCM 18, and a spindle motor driver 56 for supplying current to spindle motor 16. In an alternative embodiment, ROM 54 is replaced with programmable non-volatile memory, such as flash memory. PCBA 12 also includes a host interface bus 50 for conveying commands and data between HIDC 32 and the host, a microprocessor bus 36, a buffer bus 48 for conveying data between HIDC 32 and data buffer 42, and a path for conveying control signals 30 that provide for bi-directional control interactions between preamplifier 22 and HIDC 32.

Microprocessor 34 executes instructions acquired from a stored control program to control disk drive functions. These functions include reading and decoding host commands, starting up and controlling the speed of spindle motor 16, minimizing head-positioning servo off track error through control of VCM 18, managing reduced power modes of operation, and other disk drive functions. Microprocessor 34 includes an I/O port that is connected to microprocessor bus 36.

Microprocessor 34 suitably includes an embedded ROM or other non-volatile memory, such as flash memory, that stores some of the control programs it uses. Here, control programs include the instructions microprocessor 34 executes, and tables, parameters or arguments used during the execution of these programs. Microprocessor control programs may also reside in any or all of ROM 54, RAM 60, or data buffer 42. Microprocessor 34 suitable also includes a register set and a RAM.

Channel 26 has a port 120 and HIDC 32 has a port 35 that connect to microprocessor bus 36 to permit microprocessor 34 to directly communicate with channel 26 and HIDC 32. Microprocessor bus 36 also enables microprocessor 34 to communicate directly with ROM 54 and RAM 60.

In one embodiment, channel data bus 38 includes an 8-bit wide (i.e., one byte-wide) parallel path, but can employ more or fewer parallel bits in other embodiments. Depending upon applicable data transfer requirements, a 4-bit wide (nibble-wide) path or even a serial-by-bit path may be suitable for channel data bus 38.

In one embodiment, write channel 200 includes circuitry to accept write data from HIDC 32 via channel data bus 38 and port 40, to encode write data, and to produce write data signal 28 which is conveyed via preamplifier 22 to a selected transducer 20. In one embodiment, write channel 200 encodes write data in accordance with Run Length Limited (RLL) code constraints. The term "RLL" refers to a type of coding which restricts the minimum and maximum number of binary zeros between binary ones.

Read channel 198 includes circuitry to process read signal 24, and, on a time-multiplexed basis, generate decoded digital user data, decoded digital servo information data, and a digital representation of demodulated servo burst data. The decoded digital servo information data and decoded digital user data are conveyed to HIDC 32 via port 40, channel data bus 38, and HIDC NRZ port 45. Microprocessor 34 acquires the demodulated servo burst data via microprocessor port 120 and microprocessor bus 36, and uses the demodulated servo burst data to perform fine-position head-positioning servo operations. An alternative embodiment incorporates servo control circuitry in a servo IC in which case the demodulated servo burst data is provided to such IC.

In addition to HIDC NRZ port 45, HIDC 32 includes a buffer port 37 connected to buffer bus 48, and host interface port 33 connected to host-interface bus 50. HIDC 32 includes buffer manager-arbitrator circuitry that manages access to data buffer 42 and manages bidirectional exchange of data between HIDC 32 and data buffer 42 via buffer bus 48. Host interface port 33 provides for communicating with the host via host interface bus 50 and host connection 52. Suitably, host interface port 33 includes a set of host interface task file registers. Microprocessor 34 and other circuitry within HIDC 32 can read task file register contents. In one embodiment, host interface port 33 also includes a set of host command registers and host data registers for parallel transfer of commands and data via host interface bus 50.

HIDC 32 also controls disk formatting and address translation. The translating of addresses includes translating a logical block address to a cylinder/head/sector address and provides for defect management. HIDC 32 also includes error detection and correction circuitry that is used to correct errors in user data that were read from disks 14 and stored in data buffer 42.

Data buffer 42 stores data recovered from a disk 14, data provided by the host to be recorded on a disk 14, and, optionally, disk drive commands, servo information data, and control programs for microprocessor 34. The buffer manager within HIDC 32 arbitrates access to data buffer 42 when contention for access to data buffer 42 occurs as a consequence of various concurrent operations. Disk drive commands received from the host may be stored in data buffer 42 and be subsequently retrieved by microprocessor 34. Data buffer 42 preferably has sufficient capacity to hold multiple sectors of user data for both read and write operations. For example, a suitable capacity is at least 64 KB and can be more than 512 KB ROM, where KB=1024 bytes.

ROM 54 is an optional conventional ROM IC that stores at least part of the control program used by microprocessor 34. ROM 54 may be omitted in an embodiment in which microprocessor 34 includes embedded ROM suitable for replacing the functions of ROM 54. Alternatively, ROM 54 is replaced by programmable non-volatile memory, such as flash memory.

RAM 60 is an optional conventional RAM IC used to enlarge the high speed writeable memory available to microprocessor 34. RAM 60 is included in PCBA 12 when microprocessor 34 lacks sufficient internal RAM, and data buffer 42 cannot provide microprocessor 34 sufficient external storage or sufficiently fast external storage.

The host can be any electronic system that has an input/output (I/O) bus and interface connection means that is compatible with host connection 52, host interface bus 50, and host interface port 33.

Figure 2:
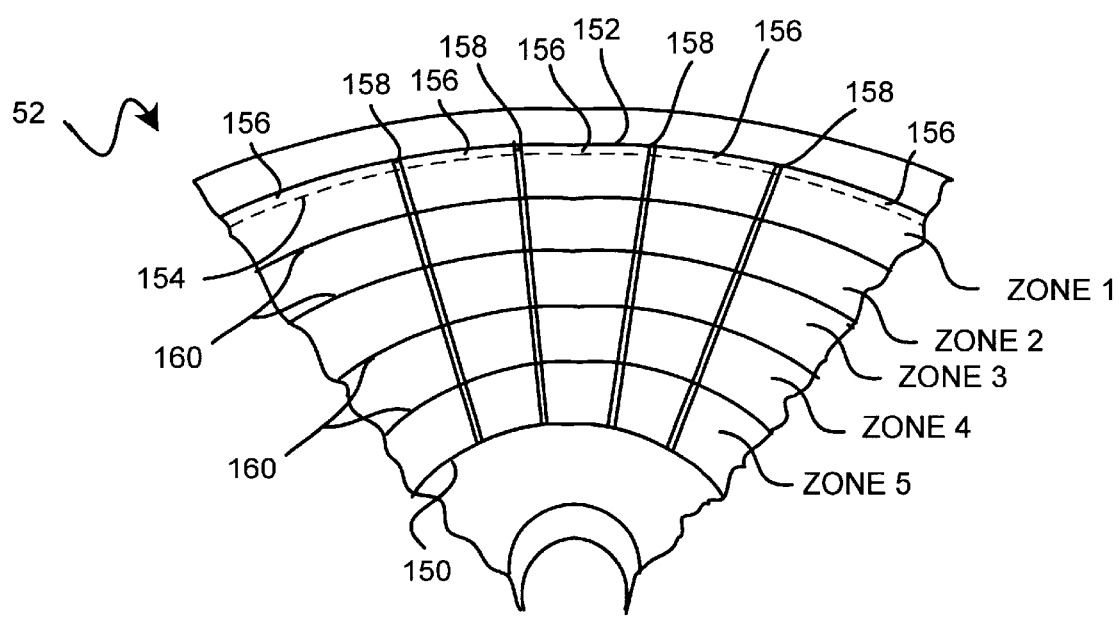
FIG. 2 is a partial plan view of a zoned recording surface including a plurality of data tracks having data regions and embedded servo sections.

FIG. 2 is a partial plan view illustrating a recording surface of disk 14. The recording surface includes an inner boundary 150 and an outer boundary 152. Data is stored on concentric, circular data tracks indicated by representative line 154. Recorded data information (i.e., user data) on the recording surface is divided into data regions indicated at 156. Data regions 156 can contain data sectors, groups of data sectors or partial data sectors. Embedded servo information is recorded in servo sectors or servo "wedges", indicated at 158 placed in radially continuous narrow regions between data regions 156. Servo sectors 158 include servo information in a number of fields.

In the embodiment of the recording surface of disk 14 illustrated in FIG. 2, the recording surface has five physical recording zones labeled Zone 1, Zone 2, Zone 3, Zone 4, and Zone 5 which are separated by partitions 160. The recording surface of disk 14 may be partitioned into any desirable, usable number of zones, which more typically ranges between 10 to 16 zones. The recording zones are used to assign groups of adjacent data tracks to a plurality of zones between inner boundary 150 and outer boundary 152. The establishment of recording zones permits efficient recording of data by varying recording frequencies to maintain approximately constant linear bit density across the disk.

Each recording zone includes adjacent data tracks 154, each of which has data recorded in its data region 156 at a single channel frequency, with the channel frequency varying from recording zone to recording zone. Likewise, the data tracks 154 in each recording zone includes servo sectors 158, each of which has servo information recorded therein at a single channel frequency, with the channel frequency varying from recording zone to recording zone. The term "channel frequency" or $f_{ch}$ as used herein has its customary meaning in this art. That is, the channel frequency $f_{ch}$ is approximately the reciprocal of a time period "T," where the "T" is the time period consumed while an elemental-length magnet passes under the transducer during a read operation with the disk spinning at a constant angular velocity. In this regard, the length of each magnet recorded along a track as a result of a write operation is, to a first order of approximation, either an elemental length or an integer multiple of the elemental length.

Selection of channel frequency is suitably determined by the linear track length, transducer flying height, media quality (e.g., disk surface smoothness, quality of the magnetic coating material, and the like) and constraints imposed by channel 26. Typically, the channel frequency increases in an outward radial direction. For data recording zones, the channel frequency of the innermost zone has the smallest channel frequency and the channel frequency increases outwardly from zone to zone, wherein the channel frequency of the outermost zone has the largest channel frequency. This increase in channel frequency from zone to zone (whether for user data or servo data or both) allows linear bit density to be maintained at or near an optimal level while moving from inner to outer data tracks 154.

In one embodiment read channel 198 provides for processing a read signal that alternately defines servo information data at a servo channel frequency and user data at a data channel frequency different from the servo channel frequency.

For both servo zones and data zones, the zone to zone frequency change need not be the same from zone to zone, and the number of data tracks within a zone may change from zone to zone. For example, fewer data tracks may be provided in the outer zone than the inner zone.

Channel 26 includes a microprocessor addressable register set 122; an address decoder 124 for selecting registers within register set 122 in response to addresses applied to microprocessor port 120 via the bidirectional microprocessor bus 36, and channel control logic 43.

During write operations, write channel 200 receives encoded write data from read channel 198 via a channel write data bus (not shown). In turn, read channel 198 receives write data from HIDC 32 via channel data bus 38, port 40, and the internal NRZ data bus, encodes the write data, and forwards the encoded data to write channel 200. Write channel 200 performs any required write precompensation according to the present invention, as described in detail below, and generates serial write data signal 28 which is conveyed to preamplifier 22.

Some registers in register set 122 contain parameters that control the read and write operations performed by channel 26. Microprocessor 34 initializes these registers by writing data into the registers via microprocessor bus 36, microprocessor port 120, and register bus 126. Other registers in register set 122 are used to store state information generated within read channel 200.

Whether reading or writing, microprocessor 34 selects a register of register set 122 by sending the address to register address decoder 124 via microprocessor bus 36, microprocessor port 120, and an internal register address bus (not shown). Address decoder 124 decodes the address and generates a register select signal that selects the register to be operated upon.

Channel 26 includes separate bit parallel I/O ports, where port is employed for exchanging NRZ read data and NRZ write data with HIDC 32 and microprocessor port 120 is employed and for providing microprocessor 34 with access to registers in register set 122. Microprocessor 34 can directly control channel 26 via microprocessor port 120 and address decoder 124 and can indirectly control channel 26 via control logic in HIDC 32. Use of separate I/O ports for data transfer (via port 40) and microprocessor 34 access to register set 122 (via microprocessor port 120) permits high speed data transfer to occur without interruption via port 40 despite concurrent lower speed data transfers between register set 122 and microprocessor 34 via microprocessor port 120.

Microprocessor 34 controls channel 26 parameters to optimize channel 26 by employing registers in register set 122 that are writeable by microprocessor 34. When disk drive 8 is first powered on (or reset), microprocessor 34 retrieves channel parameters from ROM 54 or other nonvolatile memory and initializes channel 26 by storing these parameters in register set 122. These channel parameters are subsequently used by channel 26 while configuration data are read from reserved data sectors on disks 14. The configuration data are first stored in data buffer 42, and subsequently, all or part of this configuration data may be stored in RAM 60. Subsequent to recovering configuration data from disks 14, microprocessor 34 uses channel parameters included in the configuration data to initialize register set 122.

The term "channel parameter storage" as used herein includes any memory in PCBA 12 that provides storage for channel parameter data that microprocessor 34 reads and uses to program the contents of register set 122 and can include embedded ROM or embedded RAM in microprocessor 34, ROM 54, RAM 60, data buffer 42, or memory in HIDC 32. The term "configuration data" as used herein refers to channel parameters recovered from reserved disk tracks and stored in writeable parts of channel parameter storage. Portions of ROM included in microprocessor 34 and/or ROM 54 are used as channel start up parameter storage which stores the channel start up parameters used by channel 26 while configuration data are recovered from the reserved disk drive cylinders. Channel parameter storage includes channel start up parameter storage. Microprocessor 34 recovers channel start up parameters from channel start up parameter storage and loads these parameters into selected registers in register set 122.

Individual registers in registers set 122 may, for communication with microprocessor 34, be writeable and readable, readable but not writeable, or writeable but not readable in any suitable combination. Similarly, the circuitry connecting registers in register set 122 to read channel 198 or write channel 200 may be from register to channel, channel to register, or bi-directional in a manner suitable for each register.

For ease of discussion and illustration, microprocessor addressable registers 122 are shown grouped separately from read channel 198 and write channel 200. Preferably, some registers in register set 122 are located near or amongst the read channel 198 or write channel 200 circuitry they serve.

Port 40 receives user write data from and provides user read data and servo read data to HIDC 32 via channel data bus 38. Within channel 26, NRZ data are exchanged between port 40 and read channel 198 in a bidirectional manner via the bidirectional internal NRZ data bus (not shown). The Internal NRZ data bus preferably has the same width as channel data bus 38, for example, eight bits parallel.

During disk drive read operations and while channel 26 is sending data to HIDC 32, read channel 198 provides a NRZ read clock to port 40, and port 40 sends this clock to HIDC 32 as NRZ clock 41. NRZ clock 41 is synchronized with NRZ data being conveyed to HIDC 32 via channel data bus 38.

During disk drive write data operations and while HIDC 32 is sending data to channel 26, port 40 also provides a NRZ write clock to read channel 198 and write channel 200. The NRZ write clock may be generated by a state machine within port 40 or may optionally be acquired from the NRZ clock 41 as provided by HIDC 32. The data received by read channel 198 are encoded by encoder circuitry within read channel 198 and subsequently provided to write channel 200 via the channel write data bus (not shown). For certain special disk write operations, read channel 198 may provide unencoded write data (data as received from port 40) to write channel 200.

As for channel control logic 43, this is shown as being concentrated in a single functional block for convenience of illustration. Some of the circuitry of channel control logic 43 preferably is located near or amongst the other functional blocks included in channel 26. Some of the signal processing circuitry in channel 26 is pipelined such that certain signals of the set constituting timing and control signals 44 need to be applied to sequential stages of the pipeline with appropriate delays.

Figure 3:
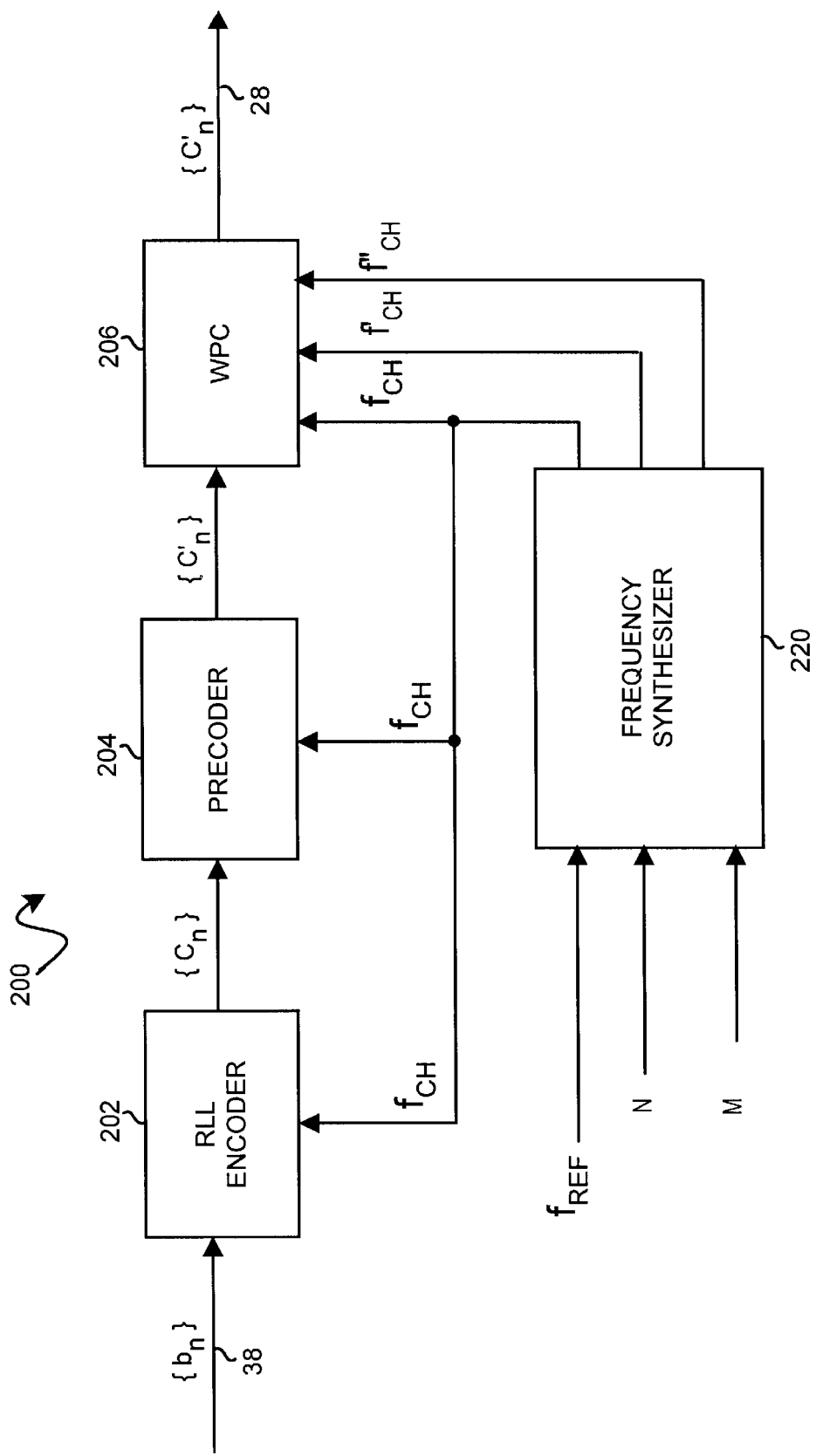
FIG. 3 is a block diagram of a write channel of the hard disk drive of FIG. 1.

Referring to FIG. 3, write channel 200 includes a RLL encoder 202; a predecoder 204; a write precompensation circuit (WPC) 206; and a frequency generator, such as a frequency synthesizer 220. Frequency synthesizer 220 receives a reference frequency ($f_{ref}$) and N and M channel frequency coefficients to generate a plurality of primary phase write clock signals $f_{ch},f'_{ch},f''_{ch}$. Registers in register set 122 in channel 26 provide the N channel frequency coefficient and the M channel frequency coefficient to frequency synthesizer 220. Each of the primary phase write clock signals $f_{ch},f'_{ch},f''_{ch}$ has a selected primary phase shift, such as 60 degrees, from another one of the primary phase write clock signals $f_{ch},f'_{ch},f''_{ch}$. Preferably, the selected primary phase shift between two selected primary phase write clock signals $f_{ch},f'_{ch},f''_{ch}$ defines a subset of secondary phase write clock signals, such as subsets 350,352, or 354 of FIG. 5.

RLL encoder 202 receives an input signal from HIDC 32 via channel data bus 38 defining a sequence of input bits $\{b_n\}$, receives primary phase write clock signal $f_{ch}$, and generates an output signal defining a sequence of code bits $\{C_n\}$. RLL encoder 202 receives its input signal from channel data bus 38 as a serial by block, parallel by bit signal and provides its output signal as a serial by bit signal to precoder 204, which is clocked by primary phase write clock signal $f_{CH}$. The RLL encoding restricts the minimum and maximum number of binary zeros between binary ones and is characterized by parameters (d,k), where d specifies the minimum number of zeros between ones and k specifies the maximum number of zeros between ones. Precoder 204 receives the sequence of code bits $\{C_n\}$ from RLL encoder 202 and generates a sequence of code bits (sequence of symbols) $\{C'_n\}$ which are modified according to a predetermined transfer function. For a channel 26 incorporating PR4ML signaling methods, the transfer function commonly used is $1/(1 \oplus D^2)$ such that the output of precoder 206 equals $C'_{n-2}$ xor $C_n$. Precoder 204 provides the sequence of symbols $\{C'_n\}$ to write precompensation circuit 206.

Write Precompensation

Write precompensation circuit 206 receives the sequence of symbols $\{C'_n\}$ (without write precompensation) and the plurality of primary phase write clock signals $f_{ch},f'_{ch},f''_{ch}$ to provide the sequence of symbols $\{C'_n\}$ (with write precompensation) on write data signal 28 to a write means, such as preamplifier 22 and transducer 20. Each of the primary phase write clock signals ($f_{ch},f'_{ch},f''_{ch}$) has a selected primary phase shift (such as 60 degrees) from another one of the primary phase write clock signals ($f_{ch},f'_{ch},f''_{ch}$). Preamplifier 22 provides write current via write data signal 17a to transducer 20 for writing the sequence of symbols $\{C'_n\}$ in a continuous-time signal on the recording surface of disk 14.

Figure 4A:
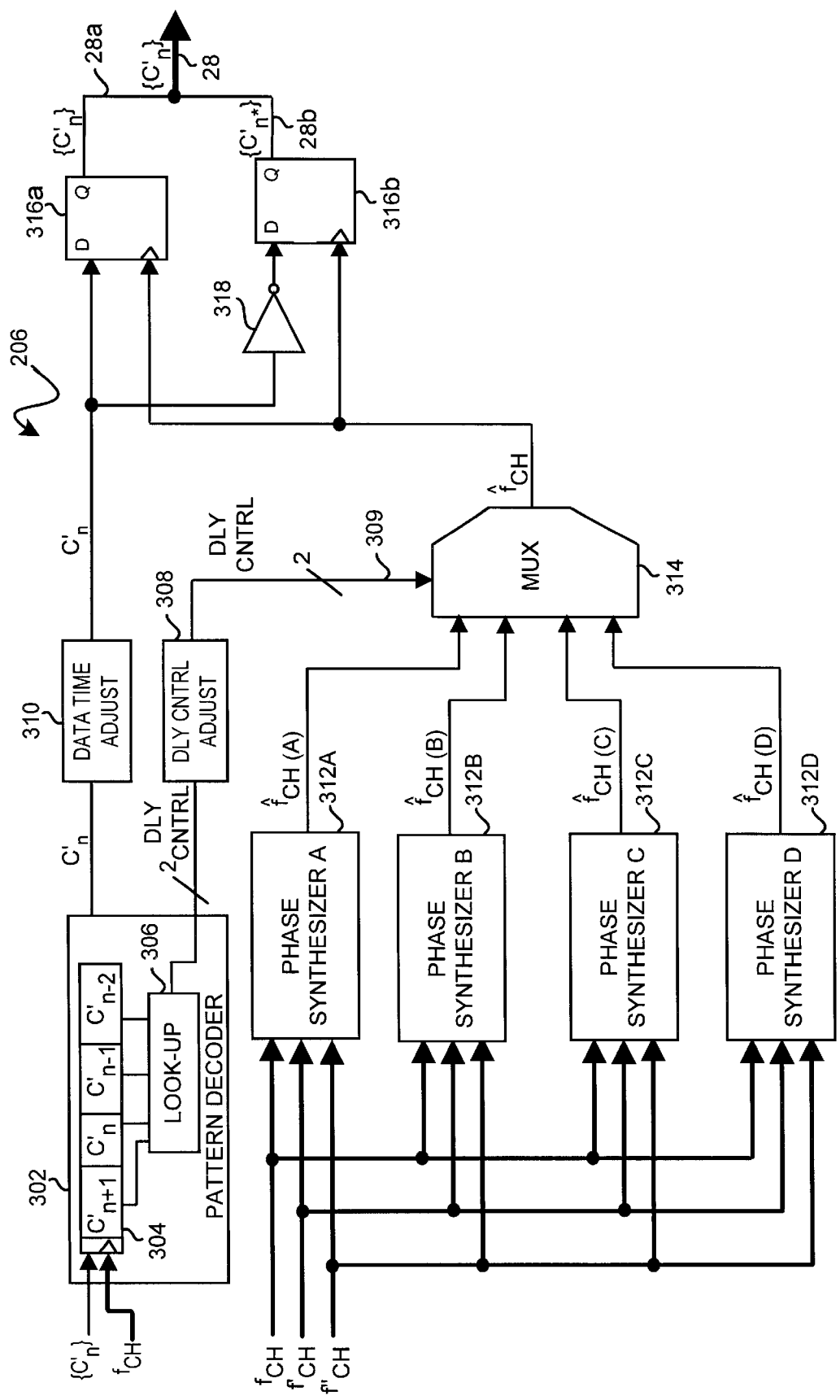
FIG. 4A is a block diagram of a write precompensation circuit in the write channel of FIG. 3.

Referring to FIG. 4A, write precompensation circuit 206 preferably includes a plurality of programmable phase synthesizers 312A, 312B, 312C and 312D for generating a plurality of secondary phase write clock signals $\hat{f}_{ch}(A)$, $\hat{f}_{ch}(B)$, $\hat{f}_{ch}(C)$, and $\hat{f}_{ch}(D)$ having the channel frequency $f_{ch}$. Each of the secondary phase write clock signals $\hat{f}_{ch}(A)$, $\hat{f}_{ch}(B)$, $\hat{f}_{ch}(C)$, and $\hat{f}_{ch}(D)$ has a selected secondary phase shift from one of the primary phase write clock signals $f_{ch},f'_{ch},f''_{ch}$ such that the selected secondary phase shift provides write precompensation for reducing timing error in the continuous-time signal recorded on the recording surface of disk 14. Preferably, programmable phase synthesizers 312A, 312B, 312C and 312D are each programmed to independently generate a selected secondary phase shift.

For each symbol $C'_n$ in the sequence of symbols $\{C'_n\}$, one of the secondary phase write clock signals $\hat{f}_{ch}(A)$, $\hat{f}_{ch}(B)$, $\hat{f}_{ch}(C)$, or $\hat{f}_{ch}(D)$ is selected as a secondary phase write clock signal $\hat{f}_{ch}$ for clocking the symbol $C'_{ch}$ in the sequence of symbols $\{C'_n\}$ to preamplifier 22 on write data signal 28. Preferably, the secondary phase shift in the selected secondary phase write clock signal $\hat{f}_{ch}$ adjusts the time for changing the direction of write current flowing through transducer 20 to adjust the time location of magnetic transitions in the data (symbols) written on the recording surface of disk 14 in order to reduce timing error. As an example of reducing timing error, the secondary phase shift in the selected secondary phase write clock signal $\hat{f}_{ch}$ compensates for expected non-linear time shift due to magnetic interactions between closely spaced magnetic transitions.

Figure 4B:
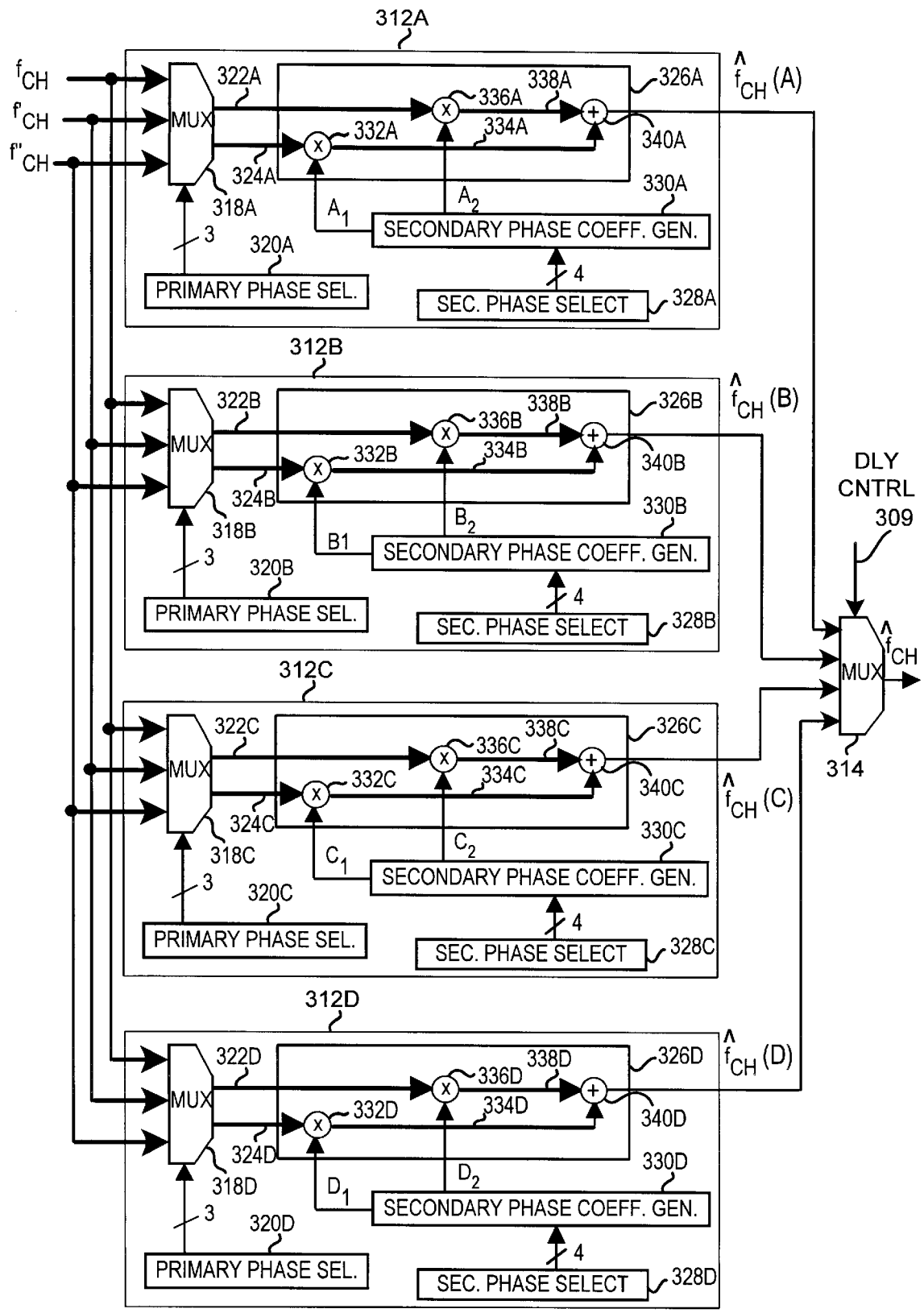
FIG. 4B is a block diagram of a plurality of programmable phase synthesizers in the write precompensation circuit of FIG. 4A.
Figure 11:
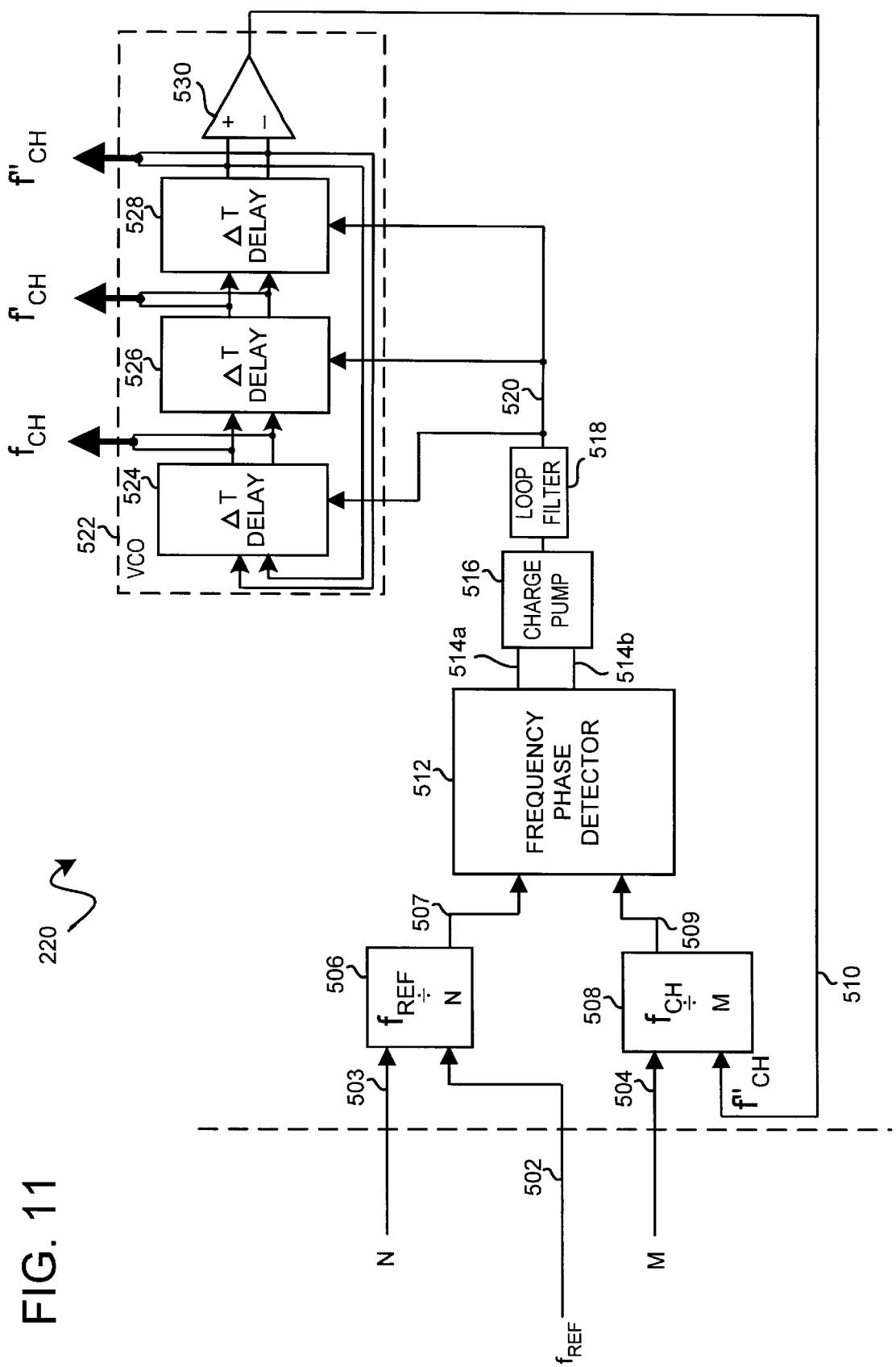
FIG. 11 is a block diagram of a frequency synthesizer for the write channel of FIG. 3.

A pattern decoder 302 receives the sequence of symbols $\{C'_n\}$ from precoder 204 in a shift register 304. Shift register 304 is clocked by the write clock signal $f_{ch}$ received on a differential line from frequency synthesizer 220. In FIGS. 4A, 4B and 11, differential lines are indicated by thicker lines while single-ended lines are indicated by normal lines. In an alternative embodiment, all single-ended line transmission is utilized instead of differential line transmission. Differential line transmission, such as illustrated in FIG. 4A and other following Figures, provides for less noise interference on the data signals transmitted along the differential lines and for simplified generation of synchronized inverted data signals.

Shift register 304 preferably stores the following symbols: the second previously written symbol ($C'_{n-2}$); the previously written symbol ($C'_{n-1}$); the symbol to be written ($C'_n$); and the next symbol to be written ($C'_{n+1}$) The four symbols $C'_{n-2}$, $C'_{n-1}$, $C'_n$, and $C'_{n-1}$ are provided as inputs to a look-up table 306 which provides a two bit delay control signal DLY CNTRL to a delay control adjust circuit 308 that delays the two bit delay control signal DLY CNTRL to multiplexer 314. The symbol to be written ($C'_n$) is provided from shift register 304 to a data time adjust circuit 310 that delays providing the symbol to be written ($C'_n$) to flip flop 316a and inverter 318.

The plurality of phase synthesizers 312A, 312B, 312C, and 312D receive primary phase write clock signals $f_{ch},f'_{ch},f''_{ch}$ on differential lines from frequency synthesizer 220 and provide secondary phase write clock signals $\hat{f}_{ch}(A)$, $\hat{f}_{ch}(B)$, $\hat{f}_{ch}(C)$, and $\hat{f}_{ch}(D)$ to multiplexer 314. The two bit delay control signal DLY CNTRL from delay control adjust circuitry 308 is provided to select inputs of multiplexer 314 to control the selection of one of the secondary phase write clock signals $\hat{f}_{ch}(A)$, $\hat{f}_{ch}(B)$, $\hat{f}_{ch}(C)$, and $\hat{f}_{ch}(D)$ as the selected secondary phase write clock signal $\hat{f}_{ch}$ to be provided as the clock signal to output flip flops 316a and 316b. The symbol $C'_n$ is provided from data time adjust circuit 310 to a data input of flip flop 316a and is inverted by an inverter 318, which provides the inverted symbol $C'_n*$ to a data input of flip flop 316b.

Delay control adjust circuitry 308 provides a delay adjustment for delaying the two bit delay control select signal DLY CNTRL provided to multiplexer 314 on line 309 in order to compensate for the delay caused by phase synthesizers 312A–312B and align the two bit delay control select signal DLY CNTRL on line 309 with secondary phase write clock signals $\hat{f}_{ch}(A)$, $\hat{f}_{ch}(B)$, $\hat{f}_{ch}(C)$, and $\hat{f}_{ch}(D)$. Similarly, data time adjustment circuitry 310 delays symbol $C'_n$ so that $C'_n$ and $C'_n*$ are respectively provided to flip flops 316a and 316b to properly align $C'_n$ and $C'_n*$ with the selected secondary phase write clock signal $\hat{f}_{ch}$. The selected secondary phase write clock signal $\hat{f}_{ch}$ clocks flip flops 316a and 316b at substantially the same time so that the sequence of symbols $\{C'_n\}$ provided on line 28a and the sequence of symbols $\{C'_n*\}$ provided on line 28b are properly aligned inverted forms of each other, such that together they form a differential signal as represented on thick line 28 as the write data signal 28 carrying symbols {C'$_n$} to preamplifier 22.

Look-up table 306 of pattern decoder 302 employs the four symbols C'$_{n-2}$, C'$_{n-1}$, C'$_n$, and C'$_{n+1}$ to generate the two bit delay control select signal DLY CNTRL for selecting the selected secondary write clock signal $\hat{f}_{ch}$. Alternatively, shift register 304 holds more or less symbols than the four symbols held by the shift register 304 illustrated in FIG. 4A. In addition, other embodiments of look-up table 306 provide more than two bits for the delay control select signal DLY CNTRL for selecting the secondary phase write clock signal $\hat{f}_{ch}$. One suitable implementation of pattern decoder 302, where shift register 304 holds four symbols and look-up table 306 provides two bits for delay control select signal DLY CNTRL, is discussed in the following paragraphs.

Table I below represents one implementation of look-up table 306 for selecting one of the secondary phase write clock signals $\hat{f}_{ch}(A)$, $\hat{f}_{ch}(B)$, $\hat{f}_{ch}(C)$, and $\hat{f}_{ch}(D)$.

TABLE I

| Pattern (spacing from previous transition) | NRZI Representation (ones represent transitions) Present transition ↓ | NRZ Representation (ones or zeros represent the two magnetic states so the present transition is ("between" states) Present transition ↓ | | | | Function (delay by :) |
|---|---|---|---|---|---|---|
| | | C'$_{n-2}$ | C'$_{n-1}$ | C'$_n$ | C'$_{n+1}$ | |
| 1T | 0    1    1 | 0 | 0 | 1 | 0 | Amount A |
|    |             | 1 | 1 | 0 | 1 |          |
| 2T | 1    0    1 | 0 | 1 | 1 | 0 | Amount B |
|    |             | 1 | 0 | 0 | 1 | (B < A)  |
| Both | 1  1    1 | 0 | 1 | 0 | 1 | Amount C |
|    |             | 1 | 0 | 1 | 0 | (approx. A − B) |
| >2T | 0   0    1 | 0 | 0 | 0 | 1 | no delay |
|    |             | 1 | 1 | 1 | 0 |          |
| No transition | X  X  0 | X | X | 1 | 1 | no delay |
|    |             | X | X | 0 | 0 |          |

Preferably, the selected secondary phase shift (delay amount) in each of the secondary phase write clock signals $\hat{f}_{ch}(A)$, $\hat{f}_{ch}(B)$, $\hat{f}_{ch}(C)$, and $\hat{f}_{ch}(D)$ depends on the sequence of symbols {C'$_{n-2}$, C'$_{n-1}$, C'$_n$, C'$_{n+1}$} in the continuous-time signal that is to be recorded on the recording surface of disk 14. Referring to table I, non-linear time shift in the continuous-time signal occurs primarily as a result of minimum magnetic transition spacings (1T) and occurs with a diminished effect at the next longer magnetic transition spacing (2T). In addition, if there are two proceeding magnetic transitions, one at 1T and the other at 2T, the non-linear time shift approximately add together. However, when the 1T transition is adjacent to the 2T transition, the 2T transition's polarity is opposite to that of the 1T transition resulting in a non-linear time shift which is approximately the difference between the two non-linear time shifts where they to operate independently. Based on the sequence of symbols {C'$_{n-2}$, C'$_{n-1}$, C'$_n$, C'$_{n+1}$}, look-up table 306 selects one of the secondary phase write clock signals $\hat{f}_{ch}(A)$, $\hat{f}_{ch}(B)$, $\hat{f}_{ch}(C)$, and $\hat{f}_{ch}(D)$ as the selected secondary phase write clock signal $\hat{f}_{ch}$ for providing write precompensation to correct for (reduce) these non-linear time shifts by writing the transition shifted by a controlled, pattern dependent amount.

Secondary phase write clock signal $\hat{f}_{ch}(A)$ has a selected secondary phase shift represented by the delay amount A; secondary phase write clock signal $\hat{f}_{ch}(B)$ has a selected secondary phase shift represented by the delay amount B, where B is less than A; secondary phase write clock signal $\hat{f}_{ch}(C)$ has a selected secondary phase shift represented by the delay amount C, where C is approximately equal to A−B; and secondary phase write clock signal $\hat{f}_{ch}(D)$ has a selected secondary phase shift that is suitably no delay. Alternatively, phase synthesizer 312D is employed to provide substantially equivalent delay (secondary phase shift) as the other phase synthesizers 312A, 312B, 312C so that secondary phase write clock signal $\hat{f}_{ch}(D)$ is kept in alignment with secondary phase write clock signals $\hat{f}_{ch}(A)$, $\hat{f}_{ch}(B)$, $\hat{f}_{ch}(C)$.

In one embodiment, the selected secondary phase shift (delay amount) in each of the secondary phase write clock signals $\hat{f}_{ch}(A)$, $\hat{f}_{ch}(B)$, $\hat{f}_{ch}(C)$, and $\hat{f}_{ch}(D)$ also depends on the channel frequency $f_{ch}$. As described above, each recording zone on the recording surface of disk 14 has a predetermined channel frequency $f_{ch}$, wherein the channel frequency $f_{ch}$ typically increases in an outwardly radial direction, such that the inner most recording zone has the smallest channel frequency $f_{ch}$, and the outermost recording zone has the largest channel frequency $f_{ch}$. During the manufacturing of hard disk drive 8, testing is performed for each recording zone to determine appropriate phase delays (secondary phase shifts) A,B,C,D for the above four patterns indicated in Table I. Suitably, an adaptive control system is used to obtain an optimal (i.e., minimal) bit error rate by selecting appropriate phase delays (secondary phase shifts) corresponding to each of the four patterns of Table I for the channel frequency $f_{ch}$ for writing the sequence of symbols {C'$_n$} in each recording zone on disk 14. These optimized selected phase delays (secondary phase shifts) for each of the four patterns for each of the recording zones are suitably stored in a reserved disk track as configuration data.

The appropriate phase delay selections (secondary phase shifts) corresponding to the patterns indicated in Table I for each corresponding recording zone are recovered from the configuration data as channel parameter data. The channel parameter data is read and used by microprocessor 34 to program the contents of a primary phase select register and a secondary phase select register in each of the programmable phase synthesizers 312A, 312B, 312C, and 312D with appropriate primary and secondary select parameters as discussed in more detail below. According to one embodiment, register set 122 of channel 26 includes the primary phase select register and the secondary phase select register in each of the programmable phase synthesizers 312A, 312B, 312C, and 312D.

Referring to FIG. 4B, each programmable phase synthesizers 312A, 312B, 312C and 312D includes a circuit, such as linear combination circuits 312A, 312B, 312C, and 312, that performs vector addition of selected primary phase write clock signals $f_{ch}, f'_{ch}, f''_{ch}$ to generate one of the plurality of secondary phase write clock signals $\hat{f}_{ch}(A)$, $\hat{f}_{ch}(B)$, $\hat{f}_{ch}(C)$, and $\hat{f}_{ch}(D)$.

Phase synthesizer 312A includes multiplexer 318A, primary phase select register 320A, linear combination circuit 326A, secondary phase coefficient generator 330A for generating secondary phase coefficients A1 and A2, and secondary phase select register 328A. Linear combination circuit 326A includes multiplier 332A, multiplier 336A, and adder 340A. Phase synthesizer 312B includes multiplexer 318B, primary phase select register 320B, linear combination circuit 326B, secondary phase coefficient generator 330B for generating secondary phase coefficients B1 and B2, and secondary phase select register 328B. Linear combination circuit 326B includes multiplier 332B, multiplier 336B, and adder 340B. Phase synthesizer 312C includes multiplexer 318C, primary phase select register 320C, linear combination circuit 326C, secondary phase coefficient generator 328C for generating secondary phase coefficients C1 and C2, and secondary phase select register 328C. Linear combination circuit 326C includes multiplier 332C, multiplier 336C, and adder 340C. Phase synthesizer 312D includes multiplexer 318D, primary phase select register 320D, linear combination circuit 326D, secondary phase coefficient generator 330D for generating secondary phase coefficients D1 and D2, and secondary phase select 328D. Linear combination circuit 326D includes multiplier 332D, multiplier 336D, and adder 340D.

Figure 5:
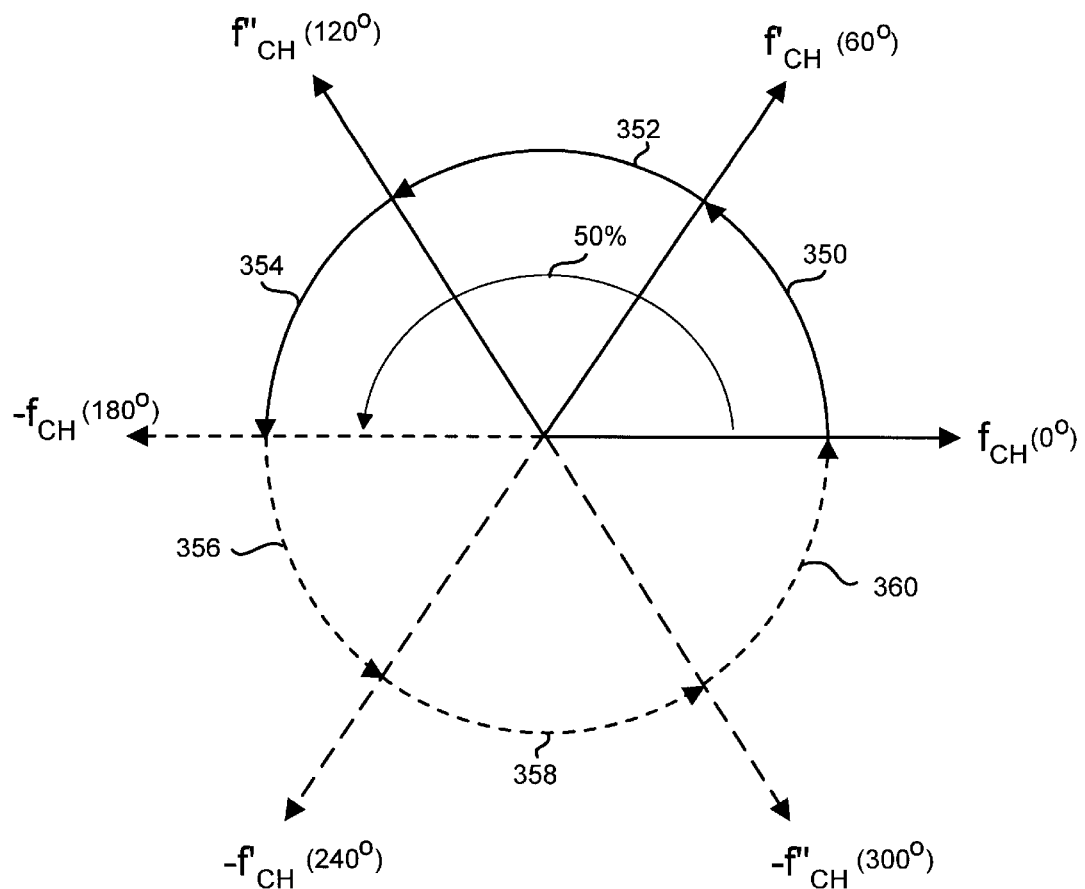
FIG. 5 is a phasor diagram representing six primary phase write clock signals and six secondary phase subsets of secondary phase write clock signals in accordance with an embodiment of the present invention.

Referring to FIG. 5, phasor diagram 500 illustrates in phase diagram form the plurality of primary phase write clock signals $f_{ch}, f'_{ch}$, and $f''_{ch}$ having the channel frequency $f_{ch}$, each of the primary phase write clock signals having a selected primary phase shift, such as 60 degrees, from another one of the primary phase write clock signals $f_{ch}, f'_{ch}$, and $f''_{ch}$. The phasor representation for each of the primary phase write clock signals $f_{ch}, f'_{ch}$, and $f''_{ch}$ represents a sine-wave, where the length of an arrow represents a write clock signal magnitude and the angle represents a write clock signal phase. In one embodiment, the phase diagram of FIG. 5 illustrates a range (subsets 350,352,354) that permits up to 50% or 180 degree phase shifts from the primary phase write clock signal $f_{ch}$. Preferably, programmable phase synthesizers 312A, 312B, 312C and 312D are each responsive to two of the primary phase write clock signals $f_{ch}, f'_{ch}, f''_{ch}$, and $-f_{ch}$ to generate secondary phase write clock signals, such as $\hat{f}_{ch}(A)$, $\hat{f}_{ch}(B)$, $\hat{f}_{ch}(C)$, and $\hat{f}_{ch}(D)$, in subset ranges 350, 352, and 354, which thereby permit 180° (i.e., 50%) phase delays (time shifts) for the selected secondary phase write clock signal $\hat{f}_{ch}$. Programmable phase synthesizers 312A, 312B, 312C and 312D are also responsive to selected secondary phase coefficients to obtain the desired resolution (step) for the secondary phase shift for each of the secondary phase write clock signals from a respective one of the primary phase write clock signals $f_{ch}, f'_{ch}$, and $f''_{ch}$.

As illustrated in FIG. 5, the primary phase write clock signal $f'_{ch}$ is shifted 60° (i.e., 16.7%) from primary phase write clock signal $f_{ch}$. Primary phase write clock signal $f''_{ch}$ is shifted 120° (i.e., 33.3%) from primary phase write clock signal $f_{ch}$. Primary phase write clock signal $-f_{ch}$ is shifted 180° (i.e., 50%) from primary phase write clock signal $f_{ch}$. Similarly, primary phase write clock signals $-f'_{ch}$ and $-f''_{ch}$ are respectively shifted 180° from the primary phase write clock signals $f'_{ch}$ and $f''_{ch}$. Thus, primary phase write clock signals $-f_{ch}, -f'_{ch}$ and $-f''_{ch}$ are obtainable by reversing the polarity of the differential pair wires of the respective opposite polarity primary phase write clock signals $f_{ch}, f'_{ch}$, and $f''_{ch}$. According to an alternate embodiment, the phase diagram of FIG. 5 illustrates another range (subsets 350, 352, 354, 356, 358, and 360) that permits up to 360 degree phase shifts from the primary phase write clock signal $f_{ch}$.

The phasor diagram of FIG. 5 illustrates a subset of secondary phase write clock signals between each of the primary phase write clock signals $f_{ch}, f'_{ch}, f''_{ch}, -f_{ch}, -f'_{ch}$ and $-f''_{ch}$. Subset 350 of secondary phase write clock signals has a range between and includes primary phase write clock signals $f_{ch}$ and $f'_{ch}$ (i.e., between 0° and 60° phase or time shift). Subset 352 of secondary phase write clock signals has a range between and includes primary phase write clock signals $f'_{ch}$ and $f''_{ch}$ (i.e., between 60° and 120° phase or time shift). Subset 354 of secondary phase write clock signals has a range between and includes primary phase write clock signals $f''_{ch}$ and $-f_{ch}$ (i.e., between 120° and 180° phase or time shift). Subset 356 of secondary phase write clock signals has a range between and includes primary phase write clock signals $-f_{ch}$ and $-f'_{ch}$ (i.e., between 180° and 240° phase or time shift). Subset 358 of secondary phase write clock signals has a range between and includes primary phase write clock signals $-f'_{ch}$ and $-f''_{ch}$ (i.e., between 240° and 300° phase or time shift). Subset 360 of secondary phase write clock signals 360 has a range between and includes primary phase write clock signals $-f''_{ch}$ and $f_{ch}$ (i.e., between 300° and 360° phase or time shift).

For clarity, the following discussion only refers to phase synthesizer 312A of FIG. 4B, but the discussion applies equally to the phase synthesizers 312B, 312C, and 312D.

Referring to phase synthesizer 312A and the phase diagram of FIG. 5, multiplexer 318A suitably receives differential primary phase write clock signals $f_{ch}, f'_{ch}, f''_{ch}, -f_{ch}, -f'_{ch}$ and $-f''_{ch}$. Multiplexer 318A receives three primary phase select bits from primary phase select register 320A for selecting two of the differential primary phase write clock signals $f_{ch}, f'_{ch}, f''_{ch}, -f_{ch}, -f'_{ch}$, or $-f''_{ch}$ as outputs on differential lines 322A and 324A. In this way, any one of the primary phase write clock signals $f_{ch}, f'_{ch}, f''_{ch}, -f_{ch}, -f'_{ch}$, or $-f''_{ch}$ can be provided from multiplexer 318A. The primary phase select register 320A provides the three primary phase select bits to control the selection of two primary phase write clock signals to select one of the subsets 350, 352, 354, 356, 358, or 360 of secondary phase write clock signals. The primary phase select register 320A is suitably one of the registers in register set 122 in channel 26, which are programmed by microprocessor 34 as explained above. The selected primary phase write clock signals on lines 322A and 324A are provided to linear combination circuit 326A.

Secondary phase select register 328A provides four secondary phase select bits to secondary phase coefficient generator 330A. In other embodiments of the present invention, secondary phase select register 328A provides more or less than four bits to secondary phase coefficient generator 330A. The number of bits provided by secondary phase select register 328A defines the number of phase shifts that are available in each subset. The secondary phase select register 328A is suitably one of the registers in register set 122 in channel 26, which are programmed by microprocessor 34 as explained above. Secondary phase coefficient generator 330A generates two secondary phase coefficients $A_1$ and $A_2$ that are provided to linear combination circuit 326A. Linear combination circuit 326A includes multiplier 332A which receives the selected primary phase write clock signal on line 324A and secondary phase coefficient $A_1$ from secondary phase coefficient generator 330A and multiplies these inputs together to provide a first vector signal output on a differential line 334A. Similarly, the selected primary phase write clock signal on line 322A and secondary phase coefficient $A_2$ generated by secondary phase coefficient generator 330A are received and multiplied by multiplier 336A which provides a second vector signal output on differential line 338A. Adder 340A adds the first vector signal output on differential line 334A and the second vector signal output on differential line 338A and provides secondary phase write clock signal $\hat{f}_{ch}(A)$ as a single-ended secondary phase write clock signal to multiplexer 314. According to an embodiment of the invention, the secondary phase write clock signal $\hat{f}_{ch}(A)$ has a phase shift θ that can be represented by the equation: phase shift $$\text{phase shift } \theta = \arctan\left(\frac{A_1 \sin 60°}{A_2 + A_1 \cos 60°}\right),$$

wherein the phase shift θ represents a phase shift from one of the primary phase write clock signals $f_{ch}$, $f_{ch}'$, $f_{ch}''$, $-f_{ch}$, $-f_{ch}'$, or $-f_{ch}''$ in a selected subset (350,352,354,356,358, 360).

The embodiment of linear combination circuit 326A suitably produces the following first order linear polynomial equation for phase synthesizer 312A: secondary phase write clock signal $\hat{f}_{ch}(A)$ is equal to $A_1P_1+A_2P_2$, where $P_1$ represents the programmably selected primary phase write clock signal on differential line 324A and $P_2$ represents the programmably selected primary phase write clock signal on differential line 322A. Alternatively, linear combination circuit 326A receives more than two primary phase write clock signals (P) and/or more than two secondary phase coefficients (A), which are thereby combined in a first order linear polynomial equation.

In another embodiment, linear combination circuit 326A is replaced with a second or higher order polynomial combination circuit.

Figure 6:
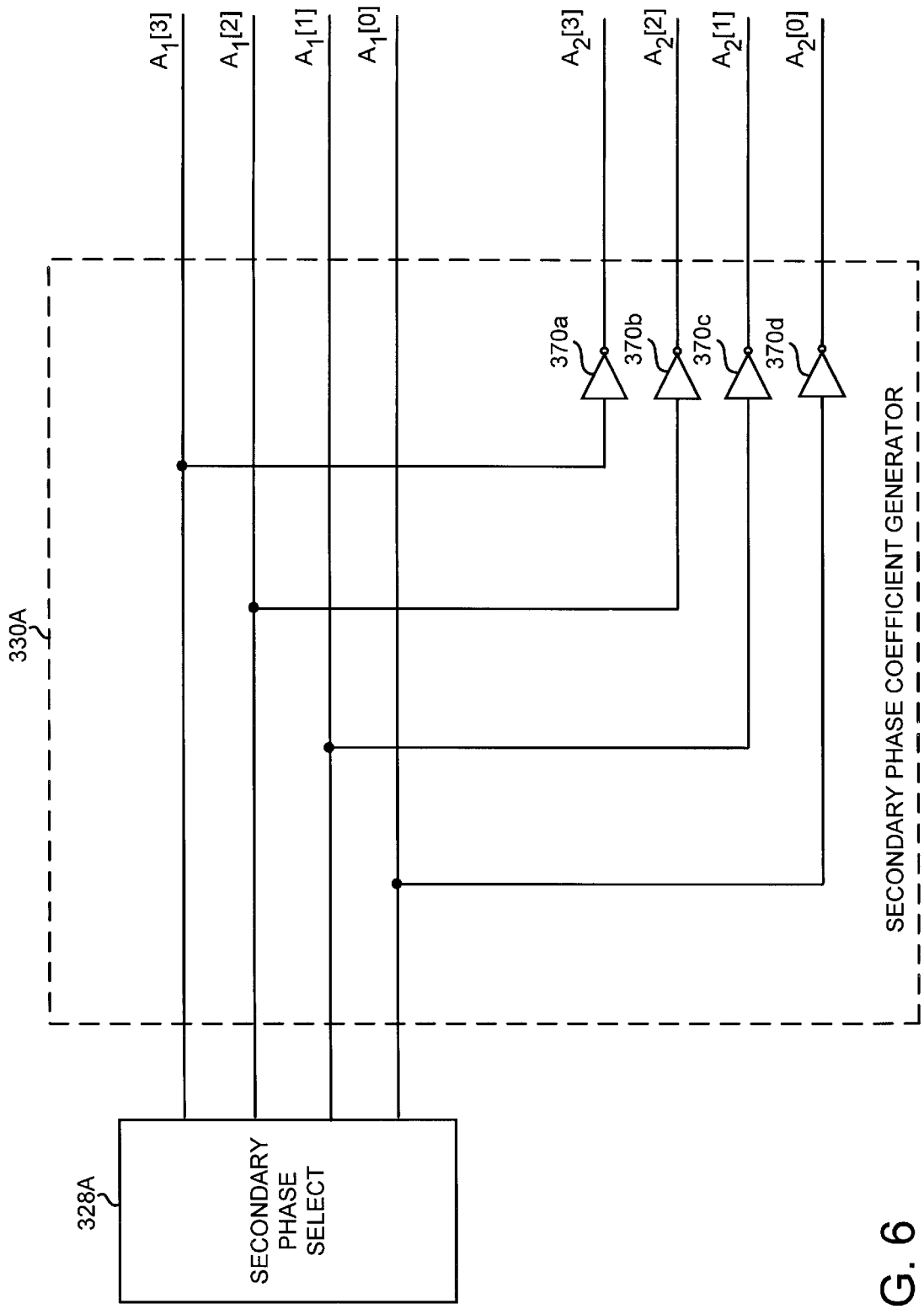
FIG. 6 is a diagram of a secondary phase coefficient generator for one of the programmable phase synthesizers of FIG. 4B.

One embodiment of secondary phase coefficient generator 330A is illustrated in schematic and block diagram form in FIG. 6. Secondary phase coefficient generator 330A suitably implements an $A_1+A_2=15$ algorithm or in binary terms $A_1[3:0]+A_2[3:0]=1111$ to derive sixteen separate pairs of secondary coefficients $A_1$ and $A_2$. As illustrated in FIG. 6, the $A_1[3:0]+A_2[3:0]=1111$ algorithm is implemented by directly providing the secondary phase select bits from secondary phase select register 328A as the $A_1[3:0]$ secondary phase coefficient bits. In addition, the $A_1[3:0]$ secondary coefficient bits are respectively inverted by inverters 370a, 370b, 370c and 370d to produce respectively secondary phase coefficient bits $A_2[3:0]$.

Figure 8:
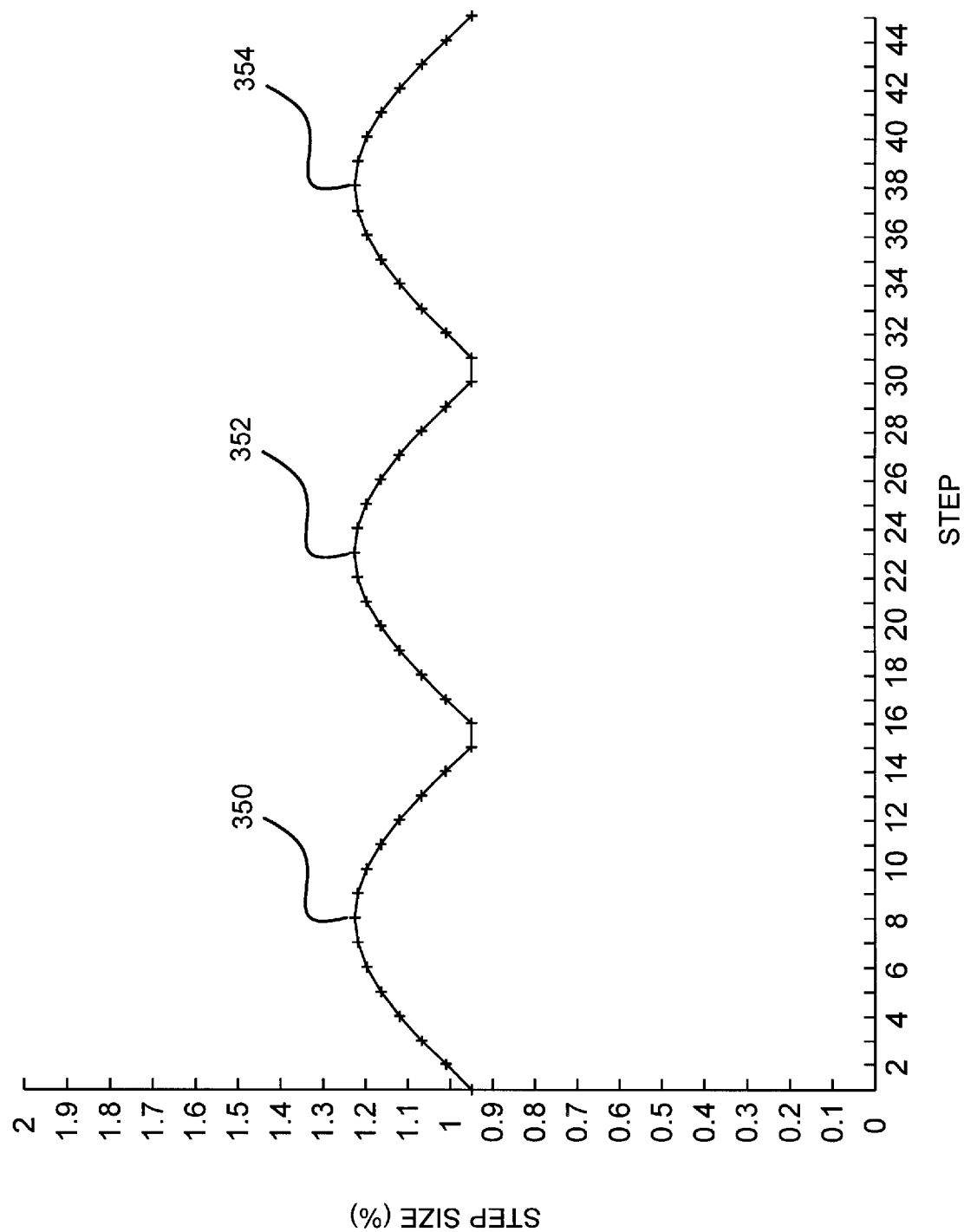
FIG. 8 is a graphical illustration illustrating relative differences in time step sizes for secondary phase write clock signals for three secondary phase subsets generated by a linear combination circuit in one of the programmable phase synthesizers of FIG. 4B.

The embodiment of secondary phase coefficient generator 330A of FIG. 6 which implements the $A_1[3:0]+A_2[3:0]=1111$ algorithm results in sixteen secondary phase write clock signals being included in each of the secondary phase subsets, such as secondary phase subset 350 between primary phase write clock signals $f_{ch}$ and $f_{ch}'$. This results in an average incremental step size of approximately 1.04% (i.e., 3.750° average phase shift) for each of the secondary phase subsets. Referring to FIG. 8, the resolution of write precompensation circuit 206 may therefore be limited by the largest incremental step size (i.e., approximately 1.2%) when secondary phase coefficient generator 330A implements the $A_1[3:0]+A_2[3:0]=1111$ algorithm. In addition, the phasor multiplication used by linear combination circuit 326A results in a 13.4% difference (when secondary phase coefficient generator 330A implements the $A_1[3:0]+A_2[3:0]=1111$ algorithm) between the maximum amplitude of the secondary phase write clock signals and the minimum amplitude of the secondary phase write clock signals generated by the linear combination of the secondary phase coefficients and the primary phase write clock signals. In other embodiments where maximum amplitude variation is required to be smaller for noise or other considerations, or where the maximum incremental step size is required to be smaller, or where a more linear approximate solution is required, other algorithm implementations can be utilized in place of secondary phase coefficient generator 330A illustrated in FIG. 6. For example, in one embodiment, a look-up table provides the two secondary phase coefficient outputs based on a four bit secondary phase select signal from secondary phase select register 328A according to any desired algorithm for correlating the output state of the secondary phase coefficients to the controlling input state of the secondary phase select signal.

Figure 7:
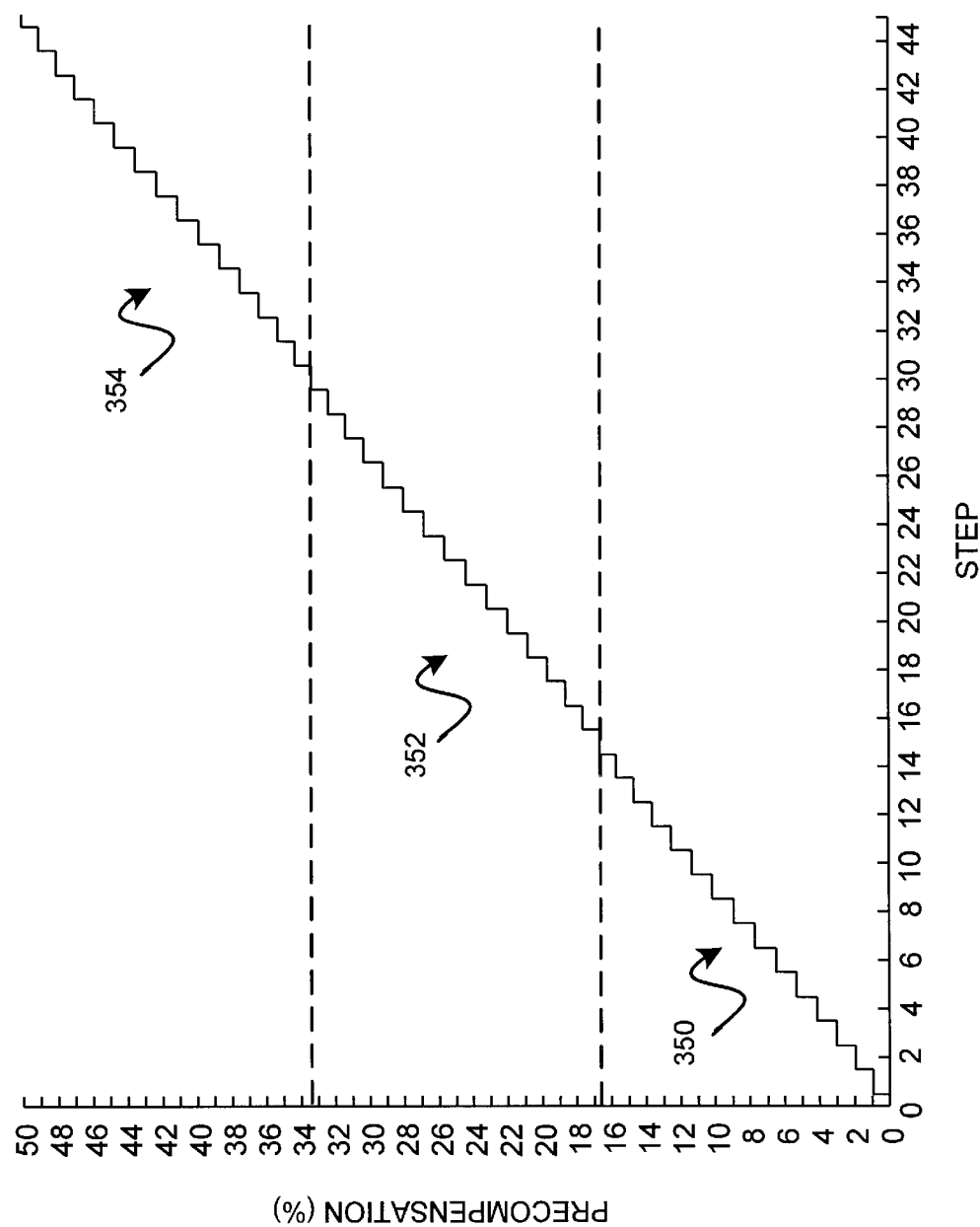
FIG. 7 is a graphical illustration illustrating absolute step sizes for three secondary phase subsets generated by a linear combination circuit in one of the programmable phase synthesizers of FIG. 4B.

The theoretical (linear) precompensation delay percentages for each of the sixteen incremental steps in each of the secondary phase subsets 350, 352, and 354 is plotted in absolute terms in FIG. 7. As indicated in FIG. 7, the final step of secondary phase subset 350 is the same absolute percentage as the first step of secondary phase subset 352. Likewise, the last step of secondary phase subset 352 is the same absolute percentage as the first step of secondary phase subset 354. As indicated in FIG. 7, secondary phase subset 350 has steps from 0 to 16.7%, secondary phase subset 352 has steps from 16.7% to 33.3%, and secondary phase subset 354 has steps from 33.3% to 50%. An example overlap situation between subsets 350 and 352 results as follows. The phase delay step size for secondary phase subset 350 will be 16.7% when $A_1=0$ and $A_2=15$ (i.e., $(0000)*f_{ch}+(1111)*f_{ch}'$). The phase delay step size for secondary phase subset 352 will also be 16.7% when $A_1=15$ and $A_2=0$ (i.e., $(0000)*f_{ch}+(1111)*f_{ch}'$).

FIG. 8 is a plot of relative step size variation in percentage from step to step for each of the secondary phase subsets 350, 352, and 354 in the embodiment that implements the $A_1[3:0]+A_2[3:0]=1111$ algorithm. There are fifteen points represented for each secondary phase subset, because each plot point represents the difference between the current step size and the previous step size (i.e., the step size variation difference). FIG. 8 provides a graphical illustration of the degree of non-linearity for the $A_1[3:0]+A_2[3:0]=1111$ algorithm; a purely linear algorithm in place of secondary phase coefficient generator 330a (e.g., a look-up table could provide a very close linear approximation) would produce a straight line at one incremental step size variation value for the plots for each secondary phase subset. The $A_1[3:0]+A_2[3:0]=1111$ algorithm provides suitable results for most write precompensation algorithms and a resolution of approximately 1.2% maximum incremental step size. The secondary phase coefficient generator 330A illustrated in FIG. 6 can be used for implementing a suitable algorithm for obtaining the secondary phase coefficients for generating the secondary phase write clock signal $\hat{f}_{ch}(A)$.

Figure 9:
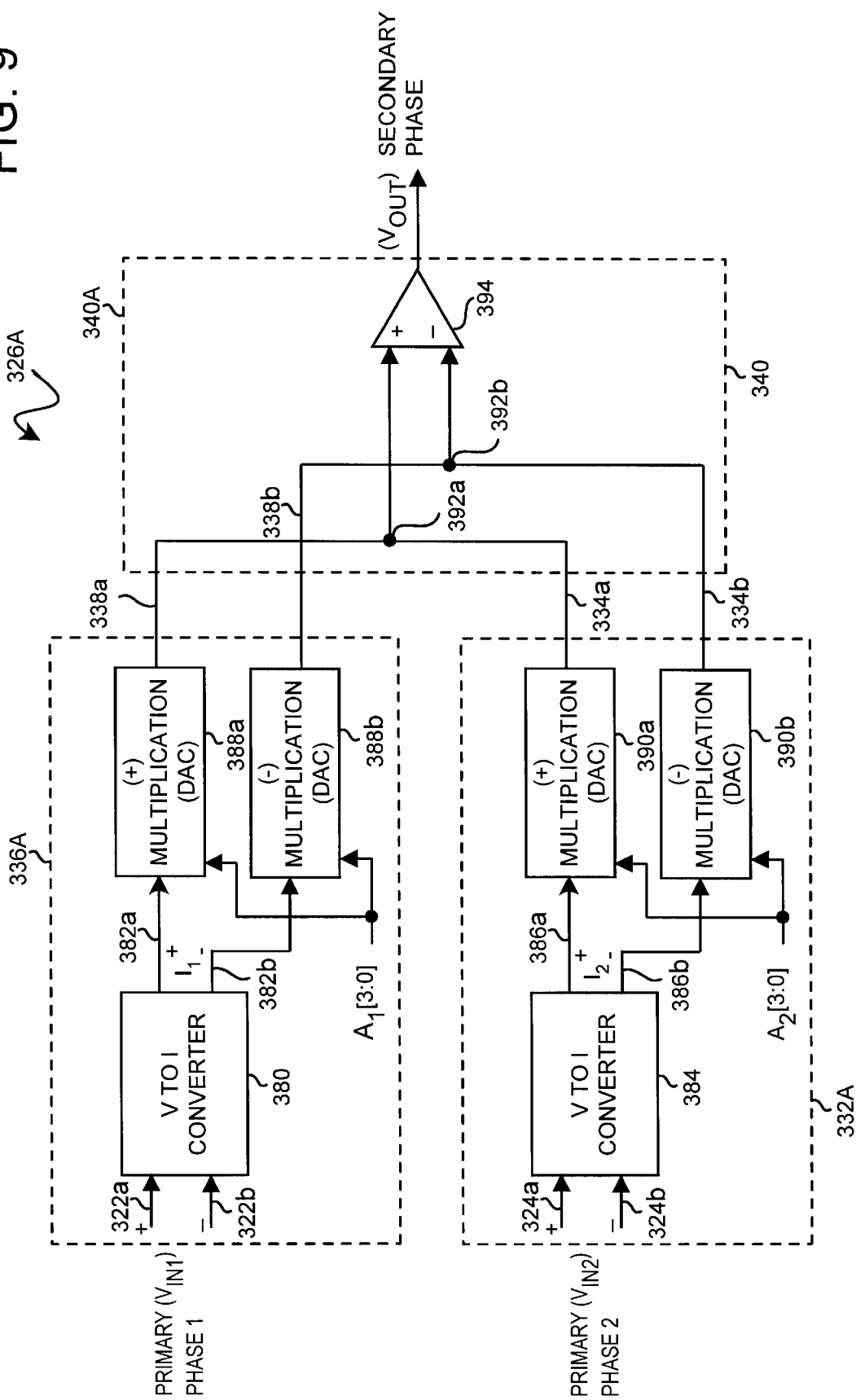
FIG. 9 is a block diagram of a linear combination circuit for one of the programmable phase synthesizers of FIG. 4B.

FIG. 9 is a block diagram of one embodiment of linear combination circuit 326A. As indicated by dashed lines in FIG. 9, multiplier 336A includes voltage-to-current converter 380, (+) multiplication DAC 388a, and (−) multiplication DAC 388b. Multiplier 332A includes voltage-to-current converter 384, (+) multiplication DAC 390a, and (−) multiplication DAC 390b. Adder 340A includes adding nodes 392a and 392b and op amp comparator 394.

Voltage-to-current converter 380 receives a first primary phase voltage ($V_{in1}$) on the differential line represented by 322a and 322b. Voltage-to-current converter 384 receives a second primary phase voltage ($V_{in2}$) on the differential line represented by 324a and 324b. Voltage-to-current converters 380 and 384 respectively provide a current representative signal on differential lines (382a and 382b) and (386a and 386b) which is responsive to the respective $V_{in1}$ and $V_{in2}$ primary phase input voltages.

The (+) current multiplication digital-to-analog converter (DAC) 388 receives the current representative signal on line 382a and multiplies it by secondary phase coefficient $A_1[3:0]$. The (−) current multiplication DAC 388b receives the current representative signal on line 382b and multiplies it by secondary phase coefficients $A_1[3:0]$. Similarly, the (+) multiplication DAC 390a receives the current representative signal 386a and multiplies it by the secondary phase coefficients $A_2[3:0]$ and the (−) multiplication DAC 390b receives the current representative signal 386b and multiplies it by secondary phase coefficients $A_2[3:0]$. (+) multiplication DAC 388a provides a product result current signal on line 338a; (−) multiplication DAC 388d provides a product result current signal on line 338b; (+) multiplication DAC 390a provides a product result current signal on line 334a; and (−) multiplication DAC 390b provides a product result current signal on line 334b.

The currents from lines 338a and 334a are added together at node 392a. The currents of lines 338b and 334b are added together at node 392b. The current signals at nodes 392a and 392b together form a differential signal which is provided to a comparator 394 which compares the two current signals and provides a single-ended secondary phase voltage signal ($V_{out}$).

Figure 10:
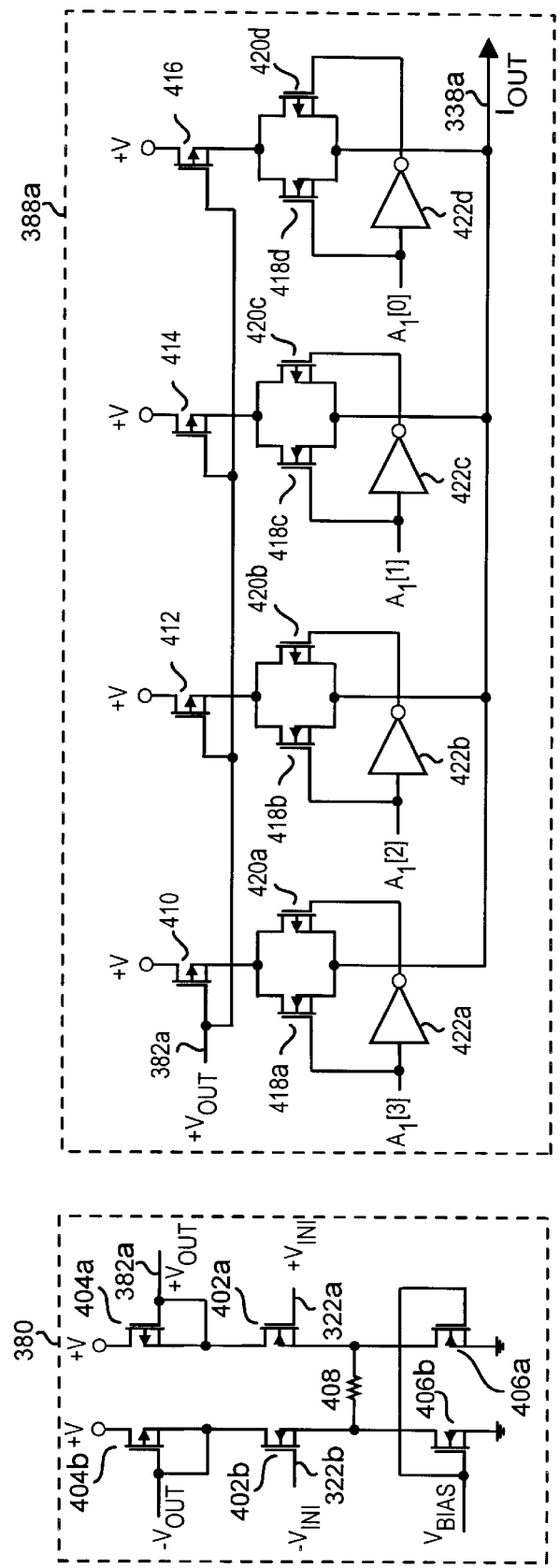
FIG. 10 is a schematic diagram of portions of the linear combination circuit of FIG. 9.

Voltage-to-current converter 380 (which is also representative of voltage-to-current converter 384) and (+) multiplication DAC 388a (which is also representative of multiplication DACs 388b, 390a, and 390b) are illustrated in detailed schematic diagram form in FIG. 10. Voltage-to-current converter 380 includes N-channel field effect transistors (N-FETs) 402a and 402b, which respectively receive the primary phase voltage $\pm V_{in1}$ on lines 322a and 322b at their gates. Voltage-to-current converter 380 also includes P-channel field effect transistors (P-FETs) 404a and 404b, which are respectively coupled between a power supply and the drains of N-FETs 402a and 402b. N-FETs 406a and 406b are respectively coupled between the sources of N-FETs 402a and 402b and ground. A resistor 408 is coupled between the sources of transistors 402a and 402b. The gates of N-FETs 406a and 406b are provided with a bias voltage ($V_{bias}$) The drains of P-FETs 404a and 404b are respectively coupled to their gates and these junctions respectively provide voltages $+V_{out}$ and $-V_{out}$. Voltage-to-current converter 380 operates such that the voltage ($\pm V_{in1}$) at the input gates of N-FETs 402a and 402b respectively controls the amount of current flowing from the power supply to ground through a first current path comprising P-FET 404a, N-FET 402a, and N-FET 406a, and the amount of current flowing from the power supply to ground through a second current path comprising P-FET 404b, N-FET 402b, and N-FET 406b. In this manner, the $+V_{out}$ voltage at the gate of P-FET 404a and the $-V_{out}$ voltage at the gate of P-FET 404b are respectively representative of the current flowing through the first current path and the second current path.

The $+V_{out}$ voltage is provided on line 382a to the gates of current source P-FETs 410, 412, 414, and 416 of (+) multiplication DAC 388a. Current source P-FETs 410, 412, 414, and 416 have their sources coupled to the power supply and provide currents from their drains which mirror (with a scaling factor) the current flowing from the source-to-drain of P-FET 404a (i.e., the first current path as defined above for voltage-to-current converter 380), because the control gates of current source P-FETs 410, 412, 414, and 416 are coupled to the $+V_{out}$ voltage at the gate and drain junction of P-FET 404a.

Current source P-FET 410 is sized to provide approximately one unit of current from its drain which mirror the current provided from the drain of P-FET 404a. Current source P-FET 412 is double the size of P-FET 410 to provide twice the current or two units of current from its drain. Current source P-FET 414 is four times the size of P-FET 410 to provide four times the current or four units of current from its drain. Current source P-FET 416 is eight times the size of P-FET 410 to provide eight times the current or eight units of current from its drain.

Secondary phase coefficient bits $A_1[3:0]$ are respectively provided to control the gates of N-FETs 418a, 418b, 418c, and 418d. Secondary phase coefficient bits $A_1[3:0]$ are respectively inverted by inverters 422a, 422b, 422c, and 422d to respectively be provided to the control gates of P-FETs 420a, 420b, 420c, and 420d. N-FET 418a and P-FET 420a are each coupled between the drain of current source P-FET 410 and output line 338a. N-FET 418b and P-FET 420b are each coupled between the drain of current source P-FET 412 and output line 338a. N-FET 418c and P-FET 420c are each coupled between the drain of current source P-FET 414 and output line 338a. N-FET 418d and P-FET 420d are each coupled between the drain of current source P-FET 416 and output line 338a. In this way, if a secondary phase coefficient $A_1$ bit is a logic one level, the current from the corresponding current source P-FET is provided to output line 338a.

Output line 338a carries a total output current which is the sum of the currents provided through transistor pairs 418a & 420a, 418b & 420b, 418c & 420c, and 418d & 420d. If secondary phase coefficient $A_1[3]$ is a logic one level, eight units of current are added to output line 338a. If secondary phase coefficient $A_1[2]$ is a logic one level, four units of current are added to output line 338a. If secondary phase coefficient $A_1[1]$ is a logic one level, two units of current are added to output line 338a. If secondary phase coefficient $A_1[0]$ is a logic one level, then one unit of current is added to output line 338a.

Frequency Synthesizer Frequency synthesizer 220 is illustrated in block diagram form in FIG. 11. A reference frequency clock signal is generated by an oscillator in channel 26 or alternatively in HIDC 32. In one embodiment, the reference frequency $f_{ref}$ is set to approximately 10 megahertz (MHz). The reference frequency $f_{ref}$ from the oscillator is an analog signal and is provided to frequency synthesizer 220 on a line 502. Registers in register set 122 in channel 26 provide an N channel frequency coefficient on a line 503 and an M channel frequency coefficient on a line 504 to frequency synthesizer 220.

Frequency synthesizer 220 includes frequency divider circuit 506 which receives the N channel frequency coefficient on line 503 and the reference frequency $f_{ref}$ on line 502 and performs frequency division to produce an output signal 507 having a frequency equal to $f_{ref}/N$. Frequency synthesizer 220 includes frequency divider circuit 508 which receives the M channel frequency coefficient on line 504 and a representative form of the primary phase write clock signal, such as primary phase write clock signal $f_{ch}"$, from a voltage controlled oscillator (VCO) 522 on a line 510. Frequency divider 508 performs frequency division to produce an output signal 509 having a frequency equal to $f_{ch}/M$.

The output signals (507 and 509) from frequency divider circuits 506 and 508 are provided to frequency phase detector 512 which detects differences between the output signals. If the channel frequency $f_{ch}$ needs to be sped up to make the inputs to frequency detector more equal, frequency phase detector 512 pulses an output line 514a to control a charge pump 516 to increase the capacitance voltage in a loop filter 518. If the channel frequency $f_{ch}$ needs to be slowed down to make the inputs to frequency phase detector 512 more equal, frequency phase detector 512 pulses an output line 514b to control charge pump 516 to reduce the capacitance voltage in loop filter 518. The output voltage of loop filter 518 is provided on a line 520 to VCO 522. VCO 522 is controlled by the voltage on line 520 and suitably includes three time delay circuits 524, 526, and 528. Time delay circuit 524 provides primary phase write clock signal $f_{ch}$. Time delay circuit 526 provides primary phase write clock signal $f_{ch}'$. Time delay circuit 528 provides primary phase write clock signal $f_{ch}''$. The voltage on line 520 controls the oscillation period (i.e., frequency) for the channel frequency $f_{ch}$, but the relative delays between the different primary phase write clock signals $f_{ch}$, $f_{ch}'$, and $f_{ch}''$ provided from time delay circuits 524, 526, and 528 remains constant. VCO 522 provides the primary phase write clock signals $f_{ch}$, $f_{ch}'$, and $f_{ch}''$ and as differential signals. A comparator 530 compares the primary phase write clock signals from time delay circuit 528 to produce the single-ended primary phase write clock signal $f_{ch}''$ on line 510, which is provided to frequency divider 508. Each of the time delay circuits 524, 526, and 528 provide 60° (i.e., 16.7%) phase shifting between the primary phase write clock signals.

The closed loop circuit formed by frequency phase detector 512, charge pump 516, loop filter 518, VCO 522, and voltage divider circuits 506 and 508 provides closed loop control to force the two inputs from frequency divider 506 and 508 to be equal. The closed loop circuit tracks the reference frequency signal to generate the primary phase write clock signals $f_{ch}$, $f_{ch}'$, and $f_{ch}''$. Thus, the channel frequency $f_{ch}=f_{ref}*M/N$. For example, if $f_{ref}=10MHz$, N=10, and M=300, then the channel frequency $f_{ch}=300$ Mhz.

Thus, the phase synthesizers in the write precompensation circuit 206 can produce fine resolution incremental steps of phase delays of a channel frequency, such as approximately 1% steps. The phase shifting used to produce the fine resolution steps does not require excessive power or excessive amounts of circuitry.

I claim:

1. A disk drive comprising:
   a disk having a recording surface;
   a write means for writing a sequence of symbols in a continuous-time signal on the recording surface;
   a frequency generator for generating a plurality of primary phase write clock signals having a channel frequency $f_{ch}$, each of the primary phase write clock signals having a selected primary phase shift from another one of the primary phase write clock signals;
   a programmable phase synthesizer for generating a secondary phase write clock signal having the channel frequency $f_{ch}$ and a selected secondary phase shift from one of the primary phase write clock signals, the programmable phase synthesizer comprising:
   (a) programmable means for selecting two of the primary phase write clock signals;
   (b) programmable means for providing a plurality of variables; and
   (c) means, responsive to the plurality of variables, for performing vector addition of the selected primary phase write clock signals to generate the secondary phase write clock signal;
   means responsive to the secondary phase write clock signal for providing at least one of the symbols in the sequence of symbols to the write means.

2. The disk drive of claim 1 wherein the plurality of variables comprises a first and second secondary phase coefficients, and the means for performing vector additions includes:
   (a) means for multiplying one of the selected primary phase write clock signals and the first secondary phase coefficient to generate a first vector signal;
   (b) means for multiplying another one of the selected primary phase write clock signals and the second secondary phase coefficient to generate a second vector signal; and
   (c) means for adding the first vector signal to the second vector signal to generate the secondary phase write clock signal.

3. The disk drive of claim 2 wherein the secondary phase coefficients are based on the selected secondary phase shift of the secondary phase write clock signal.

4. The disk drive of claim 1 further comprising:
   a plurality of the phase synthesizers for generating a plurality of secondary phase write clock signals having the channel frequency $f_{ch}$; and
   means for selecting one of the secondary phase write clock signals.

5. The disk drive of claim 1 further comprising:
   clock means for providing a reference frequency signal; and
   wherein the frequency generator includes a closed loop circuit for tracking the reference frequency signal to generate the primary phase write clock signals.

6. The disk drive of claim 5, wherein:
   the frequency generator further comprises a plurality of delay elements connected in series; and
   at least two of the primary phase write clock signals are selected from a respective output of the delay elements.

7. The disk drive of claim 1 wherein the programmable means is a first programmable means, the disk drive further comprising:
   second programmable means for providing a channel frequency coefficient; and
   wherein the frequency generator includes a frequency synthesizer coupled to the second programmable means for generating the plurality of primary phase write clock signals based on the channel frequency coefficient.

8. The disk drive of claim 1 wherein:
   the recording surface includes a plurality of tracks;
   the write means writes the continuous-time signal on a selected one of the tracks; and
   the channel frequency $f_{ch}$ is based on the selected one of the plurality of tracks.

9. A disk drive comprising:
   a disk having a recording surface;
   write means for writing a sequence of symbols in a continuous-time signal on the recording surface;
   a frequency generator for generating a plurality of primary phase write clock signals having a channel frequency $f_{ch}$, each of the primary phase write clock signals having a selected primary phase shift from another one of the primary phase write clock signals;
   a plurality of programmable phase synthesizers for generating a plurality of secondary phase write clock signals each having the channel frequency $f_{ch}$ and a selected secondary phase shift from one of the primary phase write clock signals, each programmable phase synthesizer comprising:
  (a) selection circuitry for selecting two of the primary phase write clock signals;
  (b) a memory for storing a plurality of variables; and
  (c) a vector adder, responsive to the plurality of programmable variables, for performing vector addition of the selected primary phase write clock signals to generate one of the plurality of secondary phase write clock signals;
selection circuitry for selecting one of the secondary phase write clock signals; and
means responsive to the secondary phase write clock signal for providing at least one of the symbols in the sequence of symbols to the write means.

10. The disk drive of claim 9 wherein the plurality of variables comprises a first and second secondary phase coefficients, and the vector adder includes:
  (a) a first multiplier for multiplying one of the selected primary phase write clock signals and the first secondary phase coefficient to generate a first vector signal; and
  (b) a second multiplier for multiplying another one of the selected primary phase write clock signals and the second secondary phase coefficient to generate a second vector signal; and
  (c) an adder for adding the first vector signal to the second vector signal to generate the secondary phase write clock signal.

11. The disk drive of claim 10 wherein the secondary phase coefficients are based on the selected secondary phase shift of the secondary phase write clock signal.

12. The disk drive of claim 9 further comprising:
clock means for providing a reference frequency signal; and
wherein the frequency generator includes closed loop circuit for tracking the reference frequency signal to generate the primary phase write clock signals.

13. The disk drive of claim 9 wherein the programmable means is a first programmable means, the disk drive further comprising:
second programmable means for providing a channel frequency coefficient; and
wherein the frequency generator includes a frequency synthesizer coupled to the second programmable means for generating the plurality of primary phase write clock signals based on the channel frequency coefficient.

14. The disk drive of claim 9 wherein:
the recording surface includes a plurality of tracks;
the write means writes the continuous-time signal on a selected one of the tracks; and
the channel frequency $f_{ch}$ is based on the selected one of the plurality of tracks.

15. The disk drive of claim 9, wherein:
the frequency generator further comprises a plurality of delay elements connected in series; and
at least two of the primary phase write clock signals are selected from a respective output of the delay elements.

16. A disk drive comprising:
a disk having a recording surface;
write means for writing a sequence of symbols in a continuous-time signal on the recording surface;
a reference frequency signal;
a first memory for storing a channel frequency coefficient;
a frequency synthesizer responsive to the reference frequency signal and the channel frequency coefficient for generating a plurality of primary phase write clock signals having a channel frequency $f_{ch}$, the frequency synthesizer including a closed loop circuit for tracking the reference frequency signal to generate the plurality of primary phase write clock signals, each of the primary phase write clock signals having a selected primary phase shift from another one of the primary phase write clock signals;
a programmable phase synthesizer for generating a secondary phase write clock signal having the channel frequency $f_{ch}$ and a selected secondary phase shift from one of the primary phase write clock signals, the programmable phase synthesizer comprising:
  (a) selection circuitry for selecting two of the primary phase write clock signals;
  (b) a memory for storing a plurality of variables; and
  (c) a vector adder, responsive to the plurality of programmable variables, for performing vector addition of the selected primary phase write clock signals to generate the secondary phase write clock signal;
means responsive to the secondary phase write clock signal for providing at least one of the symbols in the sequence of symbols to the write means.

17. The disk drive of claim 16 wherein the plurality of variables comprises a first and second secondary phase coefficients, and the means for performing vector additions includes:
  (a) means for multiplying one of the selected primary phase write clock signals and the first secondary phase coefficient to generate a first vector signal; and
  (b) means for multiplying another one of the selected primary phase write clock signals and the second secondary phase coefficient to generate a second vector signal; and
  (c) means for adding the first vector signal to the second vector signal to generate the secondary phase write clock signal.

18. The disk drive of claim 17 wherein the secondary phase coefficients are based on the selected secondary phase shift of the secondary phase write clock signal.

19. The disk drive of claim 16 further comprising:
a plurality of the phase synthesizers for generating a plurality of secondary phase write clock signals having the channel frequency $f_{ch}$; and
means for selecting one of the secondary phase write clock signals.

20. The disk drive of claim 16 wherein:
the recording surface includes a plurality of tracks;
the write means writes the continuous-time signal on a selected one of the tracks; and
the channel frequency $f_{ch}$ is based on the selected one of the plurality of tracks.

21. The disk drive of claim 16, wherein:
the frequency synthesizer further comprises a plurality of delay elements connected in series; and
at least two of the primary phase write clock signals are selected from a respective output of the delay elements.

22. A disk drive comprising:
a disk having a recording surface;
a write means for writing a sequence of symbols in a continuous-time signal on the recording surface;

a frequency generator for generating a plurality of primary phase write clock signals having a channel frequency $f_{ch}$, each of the primary phase write clock signals having a selected primary phase shift from another one of the primary phase write clock signals;

a programmable phase synthesizer for generating a secondary phase write clock signal having the channel frequency $f_{ch}$ and a selected secondary phase shift from one of the primary phase write clock signals, the programmable phase synthesizer comprising:
  (a) selection circuitry for selecting two of the primary phase write clock signals;
  (b) a memory for storing a plurality of variables; and
  (c) a vector adder, responsive to the plurality of variables, for performing vector addition of the selected primary phase write clock signals to generate the secondary phase write clock signal;

means responsive to the secondary phase write clock signal for providing at least one of the symbols in the sequence of symbols to the write means.

23. The disk drive of claim 22 wherein the plurality of variables comprises a first and second secondary phase coefficients, and the vector adder includes:
  (a) a first multiplier for multiplying one of the selected primary phase write clock signals and the first secondary phase coefficient to generate a first vector signal;
  (b) a second multiplier for multiplying another one of the selected primary phase write clock signals and the second secondary phase coefficient to generate a second vector signal; and
  (c) an adder for adding the first vector signal to the second vector signal to generate the secondary phase write clock signal.

* * * * *